(12) United States Patent
Ishibashi

(10) Patent No.: US 6,714,083 B2
(45) Date of Patent: Mar. 30, 2004

(54) LOCK DETECTOR AND PHASE LOCKED LOOP CIRCUIT

(75) Inventor: Atsuhiko Ishibashi, Tokyo (JP)

(73) Assignee: Renesas Technology Corp., Tokyo (JP)

(*) Notice: Subject to any disclaimer, the term of this patent is extended or adjusted under 35 U.S.C. 154(b) by 12 days.

(21) Appl. No.: 10/131,219

(22) Filed: Apr. 25, 2002

(65) Prior Publication Data

US 2002/0171296 A1 Nov. 21, 2002

(30) Foreign Application Priority Data

May 17, 2001 (JP) .................................... P2001-147514

(51) Int. Cl.[7] ................................................ H03L 7/00
(52) U.S. Cl. ...................................... 331/1 A; 331/17
(58) Field of Search ..................... 331/1 A, 17, DIG. 2

(56) References Cited

U.S. PATENT DOCUMENTS

| | | | | |
|---|---|---|---|---|
| 4,322,643 A | | 3/1982 | Preslar ........................ | 327/5 |
| 4,806,878 A | * | 2/1989 | Cowley ...................... | 331/1 A |
| 5,327,103 A | * | 7/1994 | Baron et al. ................ | 331/1 A |
| 5,909,130 A | * | 6/1999 | Martin et al. ................ | 327/12 |
| 5,942,948 A | * | 8/1999 | Smith et al. .................. | 331/8 |
| 5,956,379 A | | 9/1999 | Tarleton ...................... | 375/376 |
| 5,969,576 A | * | 10/1999 | Trodden ..................... | 331/1 A |
| 6,177,842 B1 | * | 1/2001 | Ahn et al. .................... | 331/1 A |
| 6,483,361 B1 | * | 11/2002 | Chiu .......................... | 327/159 |

FOREIGN PATENT DOCUMENTS

| | | |
|---|---|---|
| JP | 58-43932 | 9/1983 |
| JP | 62-237884 | 10/1987 |
| JP | 3080007 | 6/2000 |

* cited by examiner

*Primary Examiner*—Robert Pascal
*Assistant Examiner*—Joseph Chang
(74) *Attorney, Agent, or Firm*—Oblon, Spivak, McClelland, Maier & Neustadt, P.C.

(57) ABSTRACT

There are provided a lock detector that does not output a lock detecting signal of incorrect content even when approaching phase synchronization, when an input signal stops suddenly, or when a phase difference becomes zero momentarily in the progress that an output signal is synchronized with an input signal, as well as a PLL circuit including this lock detector. Specifically, a PLL circuit includes a lock detector (20) which comprises a reset signal output part (6, 7, 22 to 24) that outputs a reset signal (Pe) upon a phase difference between an input signal (f1) and a feedback signal (f2); and a D-FF circuit (8) that does not output a lock detecting signal (SL) upon receipt of the reset signal. The feedback signal (f2) is inputted to an NAND circuit (23) such that the reset signal is also based on the signal change of the feedback signal (f2). Further, a counter (21) performing output when the input signal (f1) reaches N-cycle is used for the clock of the D-FF circuit (8).

14 Claims, 21 Drawing Sheets

F I G. 9
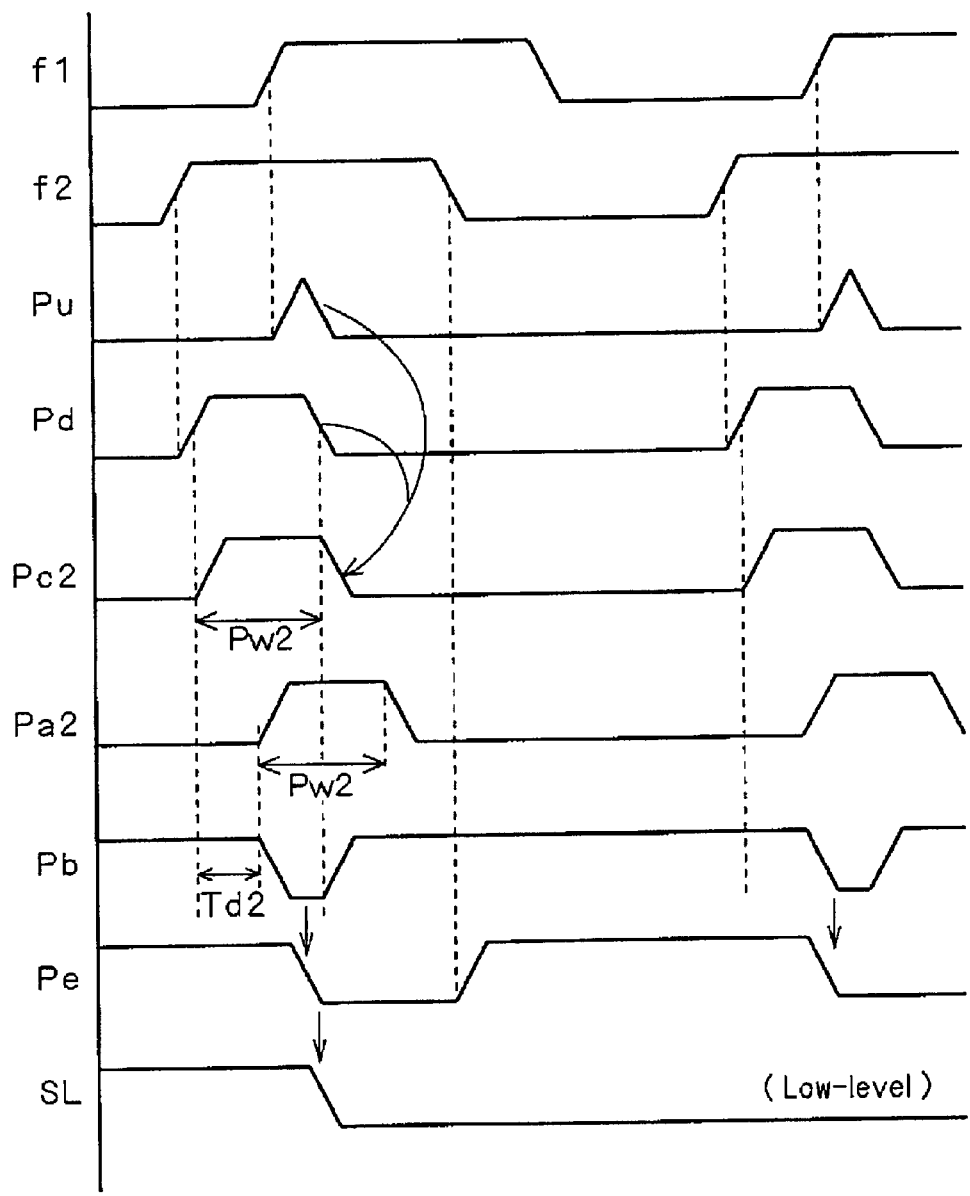

F I G. 11
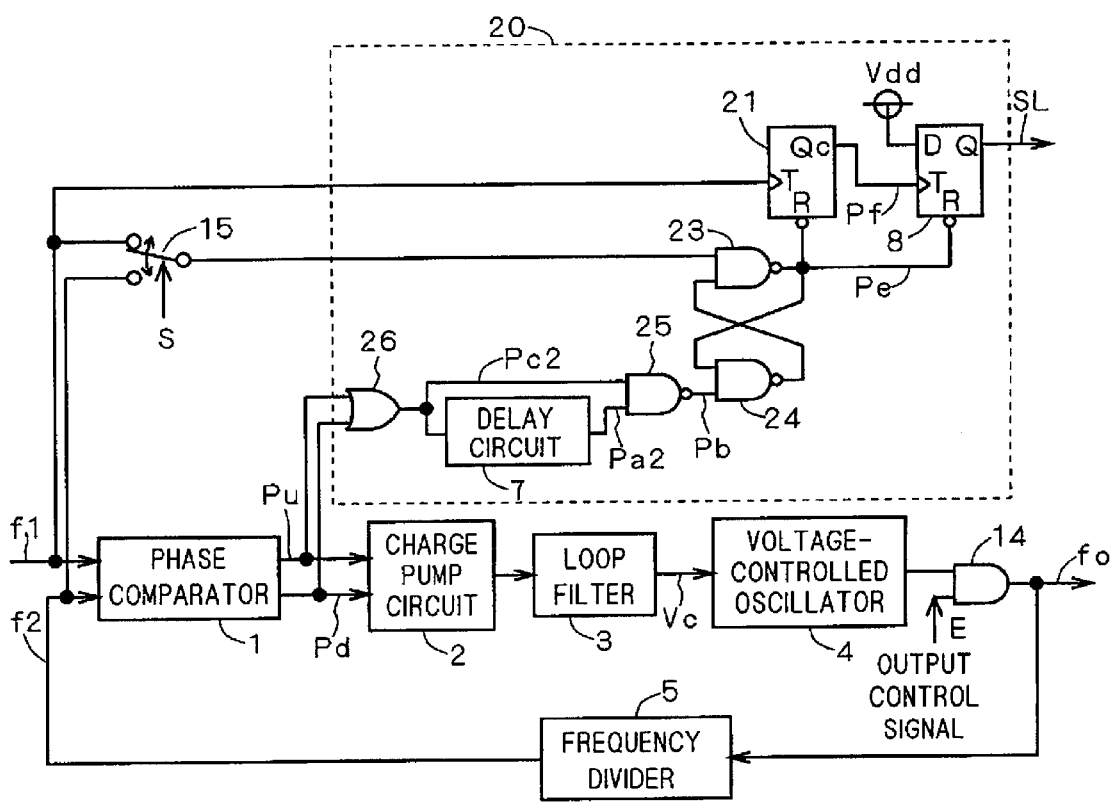

F I G. 19
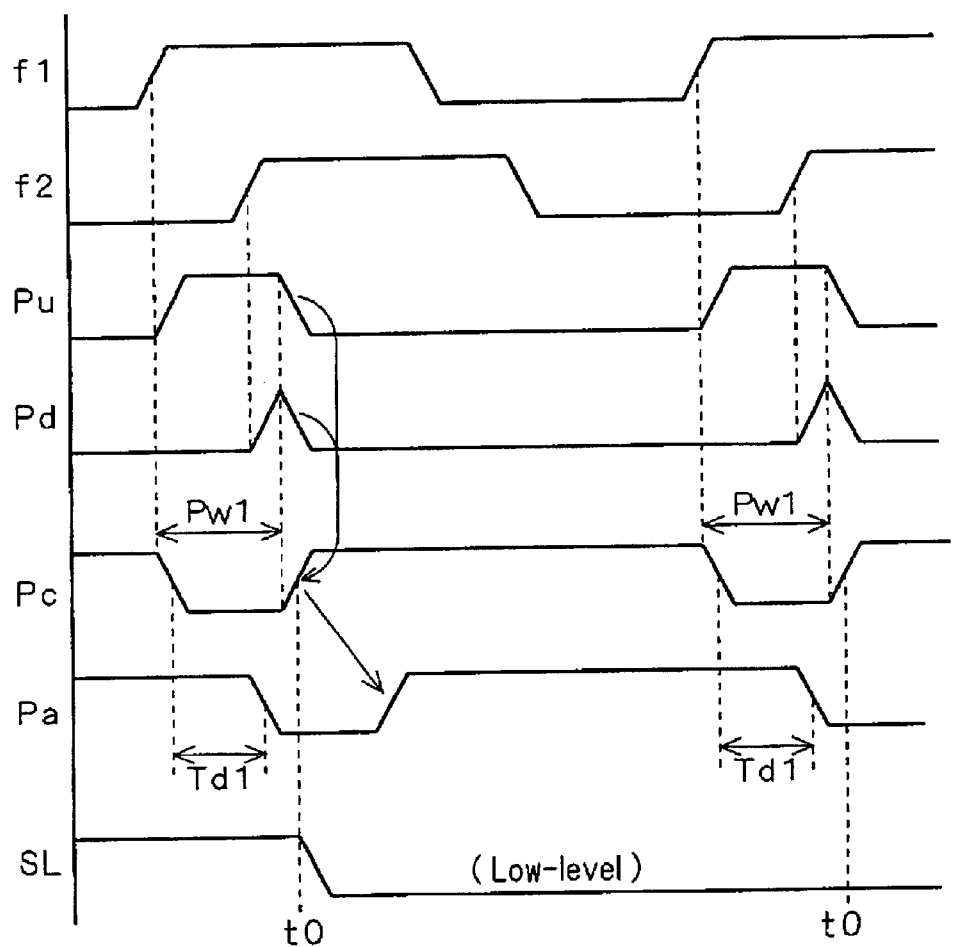

F I G. 20
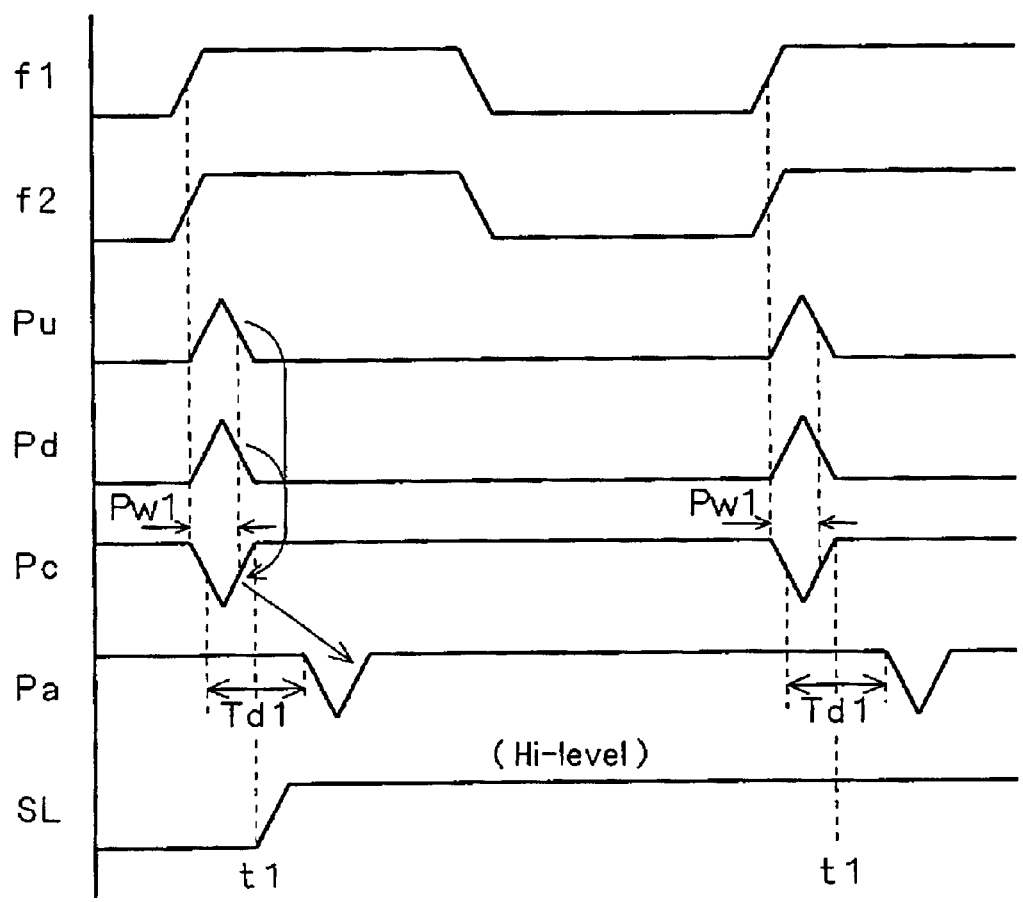

LOCK DETECTOR AND PHASE LOCKED LOOP CIRCUIT

BACKGROUND OF THE INVENTION

1. Field of the Invention

The present invention relates to a phase locked loop (hereinafter referred to as "PLL") circuit and, in particular, to a lock detector that always detects and outputs as to whether a phase difference between an input signal and an output signal is not more than a predetermined value.

2. Description of the Background Art

On a PLL circuit, it takes much time that the phase of a returning output signal is synchronized with the phase of an input signal. Therefore, in order to detect whether the phase difference between the input signal and the returning output signal is not more than a predetermined value, a lock detector monitoring phase synchronization is usually disposed on the PLL circuit. Disposing the lock detector also enables detecting as to whether the phase difference exceeds the predetermined value due to disturbance and the like, during the operation of the PLL circuit.

As a conventional PLL circuit with a lock detector, there is a technology disclosed in Japanese Patent Application Laid Open No. 10-70457 (1998). FIG. 18 illustrates the configuration of this PLL circuit.

Referring to FIG. 18, this PLL circuit comprises: a phase comparator 1 that performs a phase comparison between an input signal f1 and a feedback signal f2 that is a divided output signal; a charge pump circuit 2 that changes the pulse width according to the output of the phase comparator 1, and outputs pulse; a loop filter circuit 3 that integrates the output pulse of the charge pump circuit 2, and outputs the result as an analog voltage signal Vc; a voltage-controlled oscillator 4 that changes the oscillation frequency according to the value of the analog voltage signal Vc, and outputs an output signal fo; a frequency divider 5 that divides the output signal fo, and outputs a feedback signal f2; and a lock detector 9 that detects whether the input signal f1 and the feedback signal f2 are in phase synchronization, based on output signals Pu and Pd from the phase comparator 1.

The voltage-controlled oscillator 4 is formed by a ring counter, for example. The analog voltage signal Vc from the loop filter 3 is applied to the ring counter, and the oscillation frequency of the ring counter changes according to the value of the analog voltage signal Vc.

On this PLL circuit, the feedback signal f2 is controlled so as to be synchronized with the input signal f1. When the phase of the feedback signal f2 is behind of the phase of the input signal f1, a pulse signal of a width corresponding to such a phase difference is outputted from the phase comparator 1, as a pulse signal Pu. At this time, the value of the analog voltage signal Vc increases by the functions of the charge pump circuit 2 and loop filter 3. Upon receipt of this analog voltage signal Vc, the voltage-controlled oscillator 4 functions to increase the frequency of the output signal fo and hasten the phase of the feedback signal f2.

On the other hand, when the phase of the feedback signal f2 is ahead of the phase of the input signal f1, a pulse signal of a width corresponding to such a phase difference is outputted from the phase comparator 1, as an output signal Pd. At this time, the value of the analog voltage signal Vc decreases by the functions of the charge pump circuit 2 and loop filter 3. Upon receipt of this analog voltage signal Vc, the voltage-controlled oscillator 4 functions to decrease the frequency of the output signal fo and delay the phase of the feedback signal f2.

As used herein, the output signal Pu of the phase comparator 1 is a pulse signal that changes to "Hi" (assuming "Hi-active" in the description) at the rise of the pulse of the input signal f1. The output signal Pd of the phase comparator 1 is a pulse signal that changes to "Hi" (assuming "Hi-active" in the description) at the rise of the pulse of the feedback signal f2. One of the output signals Pu and Pd which changes to "Hi" at a later time, falls to "Low" immediately after the mentioned rise, and the other changes to "Low" together with the fall of the former.

The lock detector 9 comprises an exclusive NOR circuit 6 on which, upon receipt of the output signals Pu and Pd from the phase comparator 1, the exclusive OR of the two signals is inverted and outputted; a delay circuit 7 on which the output signal Pc of the exclusive NOR circuit 6 is delayed and outputted; and a D-flip-flop circuit 8. The D-flip-flop circuit (hereinafter referred to as "D-FF") 8 comprises a clock input terminal T to which an output signal Pc of the exclusive NOR circuit 6 is inputted; a signal input terminal D to which an output signal Pa of the delay circuit 7 is inputted; and an output terminal Q from which a lock detecting signal SL is outputted.

The delay circuit 7 is formed by a ring counter, for example. An analog voltage signal Vc from the loop filter 3 is applied to the ring counter. The delay amount of respective delay stages forming the ring counter changes depending on the value of the analog voltage signal Vc.

FIGS. 19 and 20 are diagrams illustrating timing charts of signals in the respective parts of this PLL circuit. FIG. 19 shows the case that the phase of the input signal f1 is ahead of the phase of the feedback signal f2 (i.e., an asynchronous case). FIG. 20 shows the case that phase of the input signal f1 substantially coincides with the phase of the feedback signal f2 (i.e., a synchronous case).

Regardless of whether the feedback signal f2 and input signal f1 are delayed or not, the exclusive NOR circuit 6 generates and outputs a pulse signal Pc having a pulse width Pw1 that corresponds to the phase difference between the two signals, by using the output signals Pu and Pd of the phase comparator 1 (It is supposed to be substantially synchronous in FIG. 20, however, assume there is a slight phase difference in the rise of the output signals Pu and Pd). The delay circuit 7 outputs a pulse signal Pa that is behind of the pulse signal Pc by a predetermined time Td1.

The D-FF circuit 8 fetches the state of a pulse signal Pa when the pulse signal Pc transits from "Low" to "Hi", and it outputs, as a lock detecting signal SL, "Hi" when the pulse signal Pa is "Hi", and "Low" when the pulse signal Pa is "Low".

If a pulse width Pw1 of the pulse signal Pc is larger than a delay time Td1 of the delay circuit 7, the pulse signal Pa is in "Low" level at t0 at which the pulse signal Pc transits from "Low" to "Hi" level. Therefore, the D-FF circuit 8 fetches the "Low" state, and outputs the "Low" level indicating that phase is asynchronous, as a lock detecting signal SL.

If the pulse width Pw1 of the pulse signal Pc is smaller than the delay time Td1 of the delay circuit 7, the pulse signal Pa is in "Hi" level at t1 at which the pulse signal Pc transits from "Low" to "Hi" level. Therefore, the D-FF circuit 8 fetches "Hi" state, and outputs "Hi" level indicating that phase is synchronous, as a lock detecting signal SL.

Thus, the lock detector 9 detects phase synchronous or asynchronous, based on the delay time Td1.

FIG. 21 is a circuit diagram illustrating a configuration of a phase comparator 1 disclosed in Japanese Patent Application Laid Open No. 56-169931 and U.S. Pat. No. 4,322,643. The phase comparator 1 is made up of inverter circuits 40 to 43, two-input NAND circuits 46 to 51, three-input NAND circuits 52, 53, and a four-input NAND circuits 56. In this circuit configuration, when an input signal f1 and a feedback signal f2 are both in "Low" state, output signals Pu and Pd are both in "Low" state.

When an input signal f1 firstly transits from "Low" to "Hi", signal change propagates in the following order: the inverter circuits 40, two-input NAND circuit 46, three-input NAND circuit 52, and inverter circuit 42, so that the output signal Pu transits from "Low" to "Hi". After transition of the input signal f1, when a feedback signal f2 transits from "Low" to "Hi", signal change propagates in the following order: the inverter circuit 41, two-input NAND circuit 47, three-input NAND circuit 53, and inverter circuit 43, so that the output signal Pd transits from "Low" to "Hi". Subsequently, signal change propagates in the following order: the inverter circuit 41, two-input NAND circuit 47, four-input NAND circuit 56, three-input NAND circuits 52 and 53, and inverter circuits 42 and 43, so that both of the output signals Pu and Pd transit from Hi" to "Low".

On the other hand, when a feedback signal f2 firstly transits from "Low" to "Hi", signal change propagates in the following order: the inverter circuit 41, two-input NAND circuit 47, three-input NAND circuit 53, and inverter circuit 43, so that the output signal Pd transits from "Low" to "Hi". After transition of the feedback signal f2, when an input signal f1 transits from "Low" to "Hi", signal change propagates in the following order: the inverter circuit 40, two-input NAND circuit 46, three-input NAND circuit 52, and inverter circuit 42, so that the output signal Pu transits from "Low" to "Hi". Subsequently, signal change propagates in the following order: the inverter circuit 40, two-input NAND circuit 46, four-input NAND circuit 56, three-input NAND circuits 52 and 53, and inverter circuits 42 and 43, so that both of the output signals Pu and Pd transit from Hi" to "Low".

With the foregoing configuration, on the phase comparator 1 there are generated the output signals Pu and Pd which are pulse signals of a width corresponding to the phase difference in the rise of the input signal f1 and feedback signal f2.

However, the conventional PLL circuit having the mentioned configuration suffers from the following three problems.

First Problem:

When the input signal f1 and feedback signal f2 approach phase synchronization, the phase difference therebetween is slight, and the pulse width Pw1 of the pulse signal Pc is narrowed. Therefore, in some cases the D-FF circuit 8 fails to accurately fetch the state of the pulse signal Pa. For instance, referring to FIG. 20, although the pulse signal Pc is activated on receipt of the output signals Pu and Pd, the D-FF circuit 8 is incapable of recognizing that the pulse signal Pc is activated because the pulse width Pw1 is narrow. In the case, the lock detecting signal SL is held at "Low" level. That is, there is the possibility that the incorrect content is outputted as a lock detecting signal.

Second Problem:

In the event that the input signal f1 stops suddenly in the synchronous state (i.e., the input of the input signal f1 is interrupted for any reason such as contact failure or disconnection on a circuit substrate), the pulse width Pw1 of the pulse signal Pc continues increasing (see FIG. 22, which shows the case that the input signal f1 stops at time point LP). As a result, the pulse signal Pc does not transit from "Low" to "Hi", and the D-FF circuit 8 continues applying "Hi" level indicating phase synchronization to the lock detecting signal SL, although no phase synchronization is established.

Third Problem:

On the mentioned PLL circuit, in the progress that an output signal is synchronous with an input signal, the phase difference therebetween becomes zero momentarily in some cases. Even in this case, the pulse width of the pulse signal Pc is narrow. Therefore, the output indicating phase synchronization is temporarily applied, although synchronization is not completed. FIG. 23 is a diagram illustrating how frequency changes with time in the progress that the feedback signal f2 is synchronous with the input signal f1. On a PLL circuit of which damping factor is set to a small value, a feedback signal f2 oscillates and gradually approaches the frequency and phase of the input signal f1. Therefore, even at the point indicated by mark "○" at which synchronization is incomplete, frequency momentarily coincides with phase. In this case, the conventional lock detector 9 judges it synchronous state, although synchronization is incomplete.

SUMMARY OF THE INVENTION

It is an object of the present invention to provide a lock detector that does not output a lock detecting signal of incorrect content when approaching phase synchronization, or when an input signal stops suddenly, or when phase difference becomes zero momentarily in the progress that an output signal is synchronized with an input signal, as well as a PLL circuit including this lock detector.

According to a first aspect of the invention, a lock detector includes: a reset signal output part to activate a reset signal when there is a phase difference of not less than a predetermined value between first and second pulse signals that repeat oscillation; and a signal output part that outputs a lock detecting signal indicating synchronization of the first and second pulse signals and deactivates said lock detecting signal when the reset signal is activated.

In the first aspect of the invention, when the phase difference between the first and second pulse signals is not less than a predetermined value, the reset signal is activated and the lock detecting signal is not activated. Therefore, by setting such that the signal output part activates, in principle, the lock detecting signal unless the reset signal is activated, there is no possibility that the signal output part erroneously outputs the content of the lock detecting signal as asynchronous.

According to a second aspect of the invention, a phase locked loop circuit includes: a lock detector of the first aspect; a phase comparator to compare phases of the first and second pulse signals, taking one of these signals as an input signal and taking the other as a feedback signal; a filter that outputs a control signal based on a comparison result of the phase comparator; and an oscillation circuit that outputs the feedback signal based on the control signal.

In the second aspect of the invention, a phase locked loop circuit that does not output the lock detecting signal of incorrect content can be obtained by disposing the lock detector according to the first aspect.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 9 and 10 are timing charts indicating the signals of respective parts in asynchronous state on the phase locked circuit of the third preferred embodiment;

FIG. 11 is a diagram illustrating a phase locked loop circuit according to a fourth preferred embodiment of the invention;

FIG. 19 is a timing chart indicating the signals of respective parts in asynchronous state on the phase locked circuit of the conventional phase locked loop circuit;

FIG. 20 is a timing chart indicating the signals of respective parts in synchronous state on the phase locked circuit of the conventional phase locked loop circuit;

DESCRIPTION OF THE PREFERRED EMBODIMENTS

First Preferred Embodiment

According to a first preferred embodiment, a PLL circuit with a lock detector that does not output a lock detecting signal of incorrect content is realized by disposing, on the lock detector, a reset signal output part that activates a reset signal when the phase difference between an input signal and a feedback signal is not less than a predetermined value; and a signal output part that does not activate a lock detecting signal when the reset signal is activated.

Configuration of PLL Circuit

Figure 1:
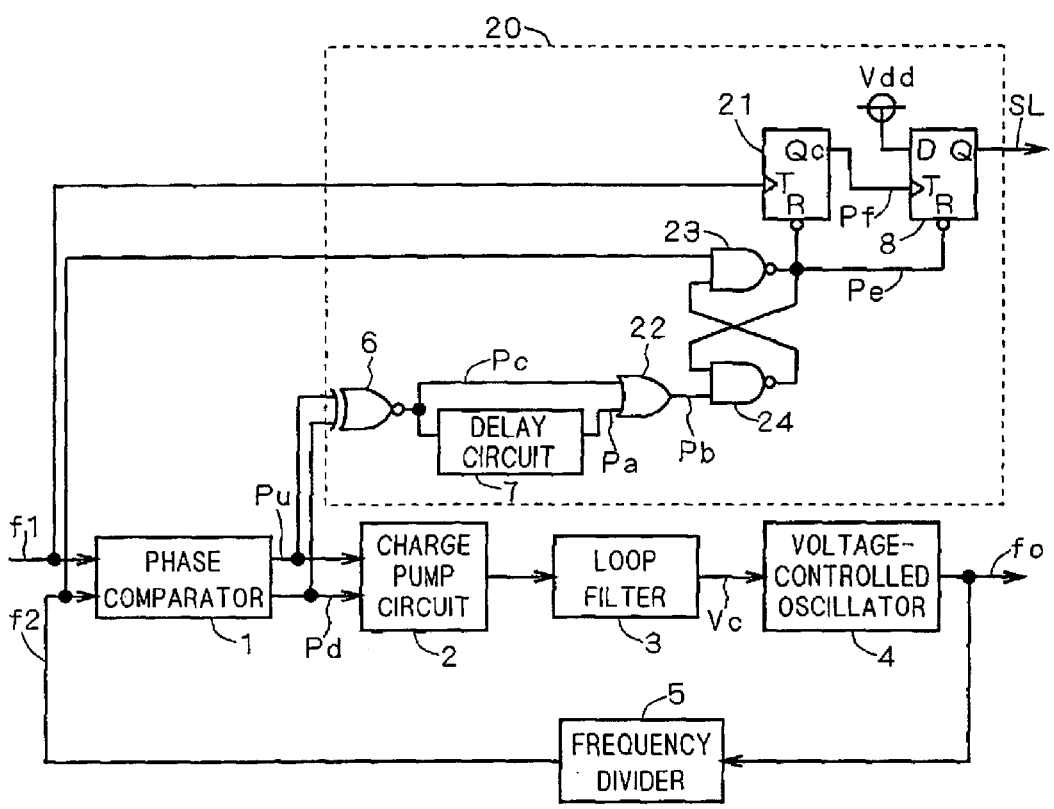
FIG. 1 is a diagram illustrating a phase locked loop circuit according to a first preferred embodiment of the invention.

FIG. 1 is a diagram illustrating a PLL circuit configuration of the first preferred embodiment. Referring to FIG. 1, like the conventional PLL circuit shown in FIG. 18, this PLL circuit comprises: a phase comparator 1 performing a phase comparison between an input signal f1 and a feedback signal f2 that is a divided output signal; a charge pump circuit 2 that changes pulse width and outputs pulse according to the output of the phase comparator 1; a loop filter circuit 3 that integrates the output pulse of the charge pump circuit 2 and outputs the result as an analog voltage signal Vc; a voltage-controlled oscillator 4 that changes oscillation frequency according to the value of the analog voltage signal Vc, and outputs an output signal fo; a frequency divider 5 that divides the output signal fo and outputs a feedback signal f2; and a lock detector 20 that detects as to whether the phase of the input signal f1 is synchronized with that of the feedback signal f2, based on the output signals Pu and Pd outputted from the phase comparator 1.

Figure 18:
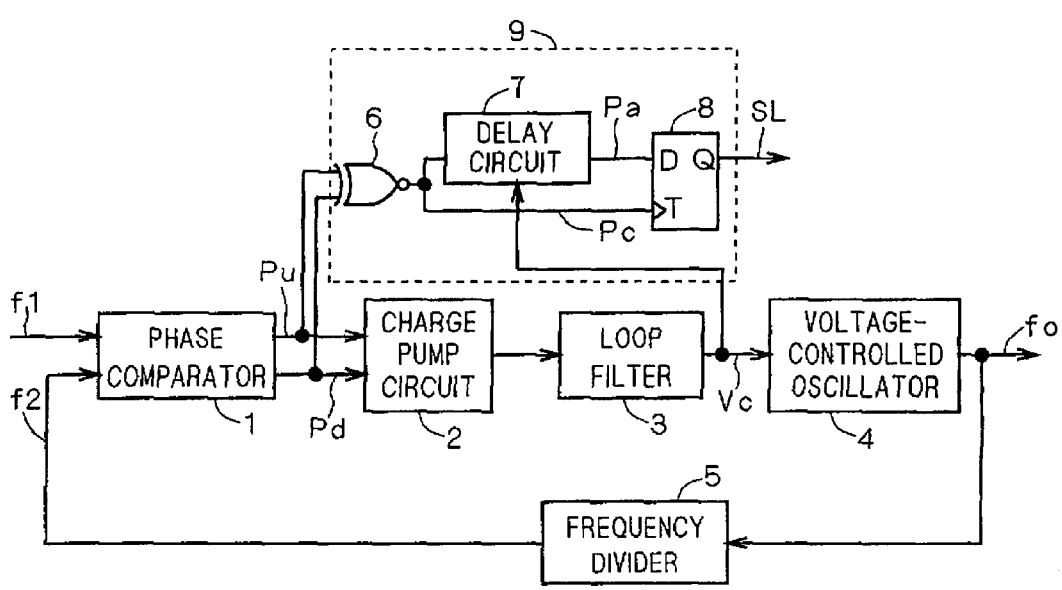
FIG. 18 is a diagram of a conventional phase locked loop circuit.

Note that the configuration of the lock detector 20 is different from that of the conventional lock detector 9 shown in FIG. 18. The lock detector 20 will be fully described hereinbelow.

The voltage-controlled oscillator 4 is formed by a ring counter, for example. An analog voltage signal Vc from the loop filter 3 is applied to the ring counter, and the oscillation frequency of the ring counter changes depending on the value of the analog voltage signal Vc.

Basic Operation of PLL Circuit

On this PLL circuit, a feedback signal f2 is controlled so as to be synchronized with an input signal f1. When the phase of the feedback signal f2 is behind of that of the input signal f1, the phase comparator 1 outputs a pulse signal of a width corresponding to its phase difference, as an output signal Pu. At this time, the value of the analog voltage signal Vc increases by the functions of the charge pump circuit 2 and loop filter 3. Upon receipt of this analog voltage signal Vc, the voltage-controlled oscillator 4 functions to increase the frequency of an output signal fo and hasten the phase of the feedback signal f2.

On the other hand, when the phase of the feedback signal f2 is ahead of the phase of the input signal f1, the phase comparator 1 outputs, as an output signal Pd, a pulse signal of a width corresponding to such a phase difference. At this time, the value of the analog voltage signal Vc decreases by the functions of the charge pump circuit 2 and loop filter 3. Upon receipt of this analog voltage signal Vc, the voltage-controlled oscillator 4 functions to decrease the frequency of the output signal fo and delay the phase of the feedback signal f2.

As used herein, the output signal Pu of the phase comparator 1 is a pulse signal that changes to "Hi" (assuming "Hi-active" in the description) at the rise of the pulse of the input signal f1. The output signal Pd of the phase comparator 1 is a pulse signal that changes to "Hi" (assuming "Hi-active" in the description) at the rise of the pulse of the feedback signal f2. One of the output signals Pu and Pd, which changes to "Hi" at a later time, falls to "Low" immediately thereafter, and the other changes to "Low" together with the fall of the former.

Figure 21:
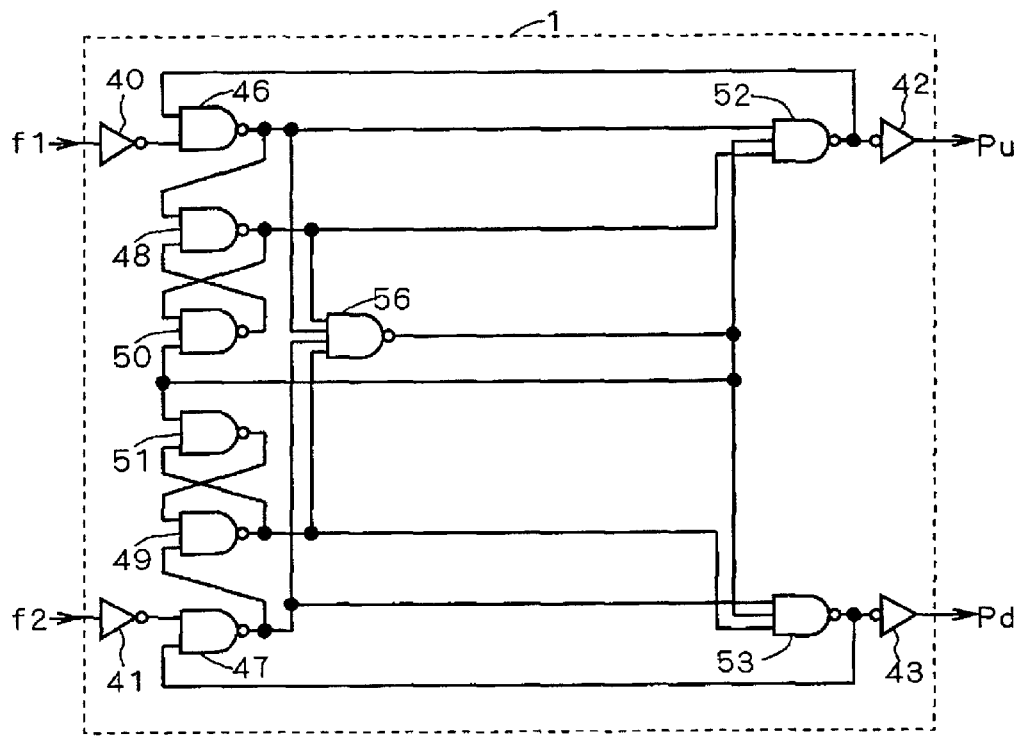
FIG. 21 is a phase comparator of the conventional phase locked loop circuit.
Figure 22:
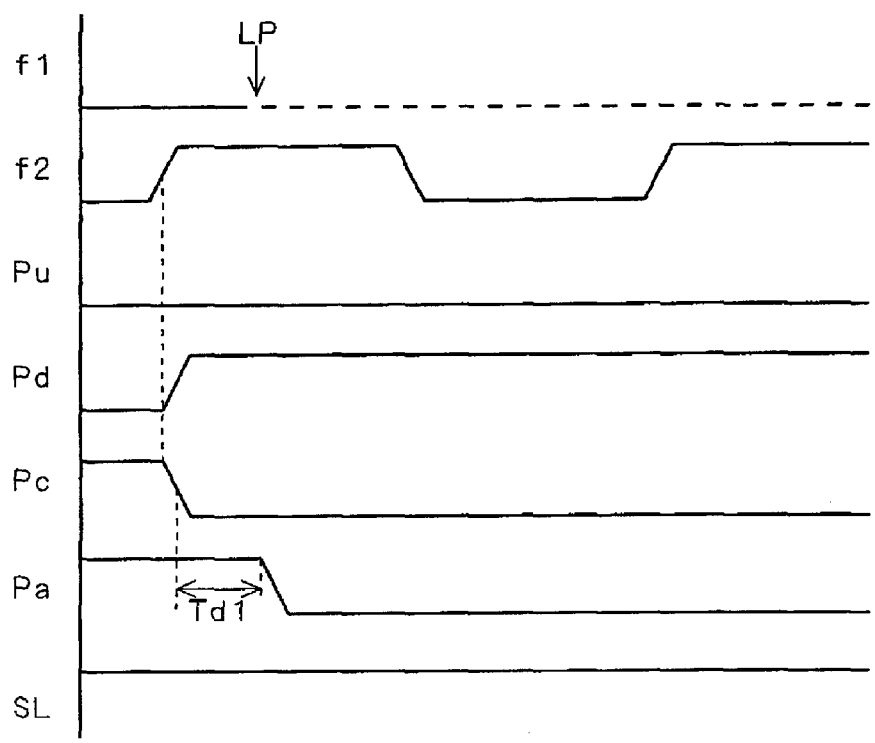
FIG. 22 is a timing chart illustrating a problem of the conventional phase locked loop circuit.
Figure 23:
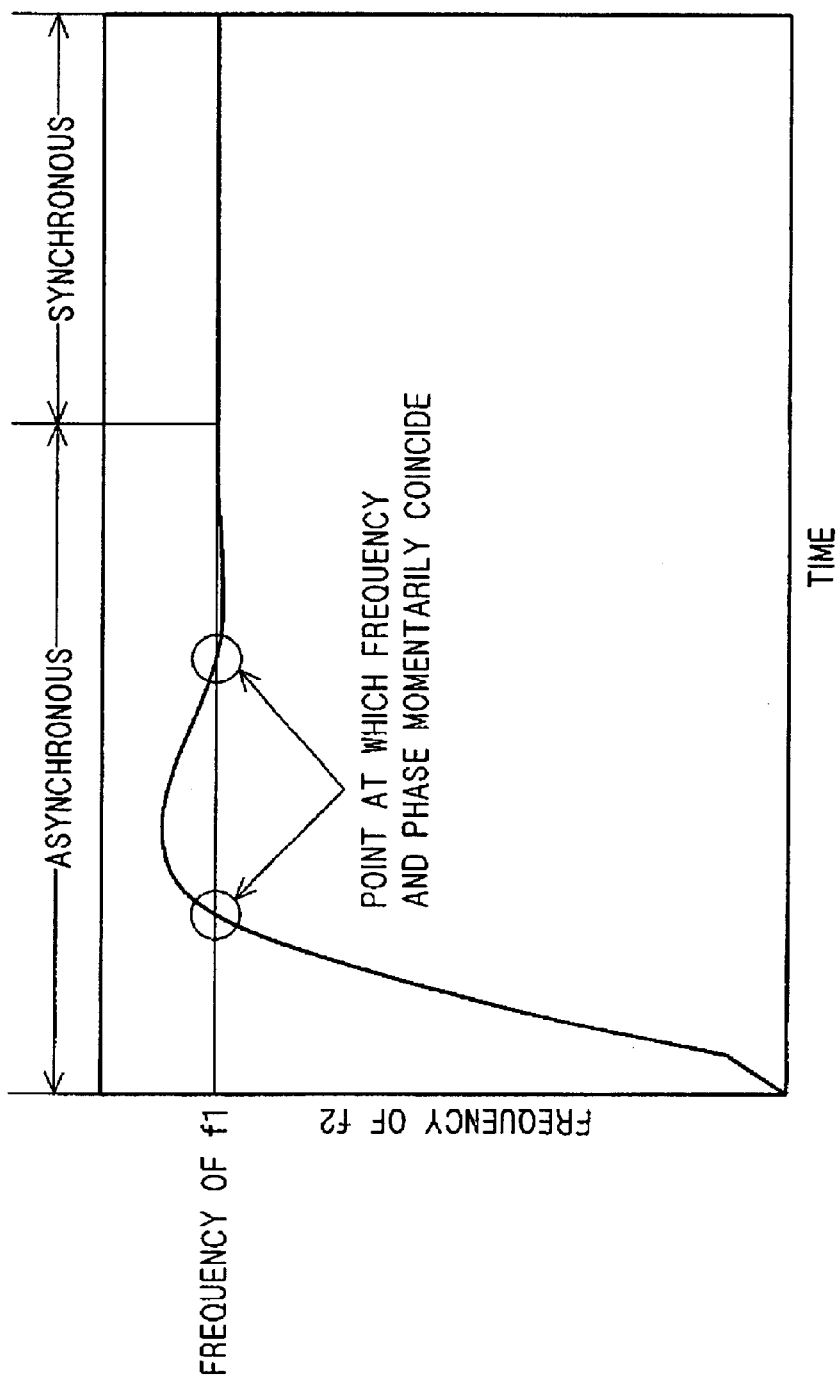
FIG. 23 is a diagram illustrating the progress of synchronization between an input signal and a feedback signal on the conventional phase locked loop circuit.

Like the PLL circuit of FIG. 18, the phase comparator 1 may have the configuration of FIG. 21. That is, with this configuration, when an input signal f1 and a feedback signal f2 are both in "Low" state, output signals Pu and Pd are both in "Low" state. If the input signal f1 firstly transits from "Low" to "Hi", the output signal Pu transits from "Low" to "Hi". If the feedback signal f2 transits from "Low" to "Hi" at a later time than the input signal f1, the output signal Pd transits from "Low" to "Hi". Thereafter, both of the output signals Pu and Pd transit from "Hi" to "Low".

On the other hand, if the feedback signal f2 firstly transits from "Low" to "Hi", the output signal Pd transits from "Low" to "Hi". If the input signal f1 transits from "Low" to "Hi" at a later time than the feedback signal f2, the output signal Pu transits from "Low" to "Hi". Subsequently, both of the output signals Pu and Pd transit from "Hi" to "Low".

Configuration of Lock Detector 20

The lock detector 20 comprises an exclusive NOR circuit 6 on which, upon receipt of the output signals Pu and Pd from the phase comparator 1, the exclusive OR of the two signals is inverted and outputted; a delay circuit 7 on which the output signal Pc of the exclusive NOR circuit 6 is delayed and outputted; an OR circuit 22 that carries out OR operation of a pulse signal Pa from the delay circuit 7 and a pulse signal Pc, and outputs the result; a NAND latch circuit formed by NAND circuits 23 and 24; a counter 21 that counts the oscillation number of an input signal f1 when the signal f1 is inputted to its clock input terminal T, and activates output when the count number reaches N(>0); and a D-FF circuit 8 to which an activated signal Vdd is always inputted.

A feedback signal f2 is inputted to one input terminal of the NAND circuit 23 forming the NAND latch circuit, and the output of the NAND circuit 24 is inputted to the other input terminal. An output signal Pb of the OR circuit 22 is inputted to one input terminal of the NAND circuit 24, and an output signal Pe of the NAND circuit 23 is inputted to the other input terminal. The output signal Pe of the NAND circuit 23 functions as a reset signal to reset the outputs of the counter 21 and D-FF circuit 8.

The counter 21 comprises a clock input terminal T through which an input signal f1 is inputted, a reset input terminal R through which a reset signal Pe is inputted, and an output terminal Qc through which an output signal Pf is outputted.

The D-FF circuit 8 comprises a clock input terminal T through which an output signal Pf of the counter 21 is inputted, a signal input terminal D through which a signal Vdd is inputted, and an output terminal Q through which a lock detecting signal SL is outputted.

Figure 2:
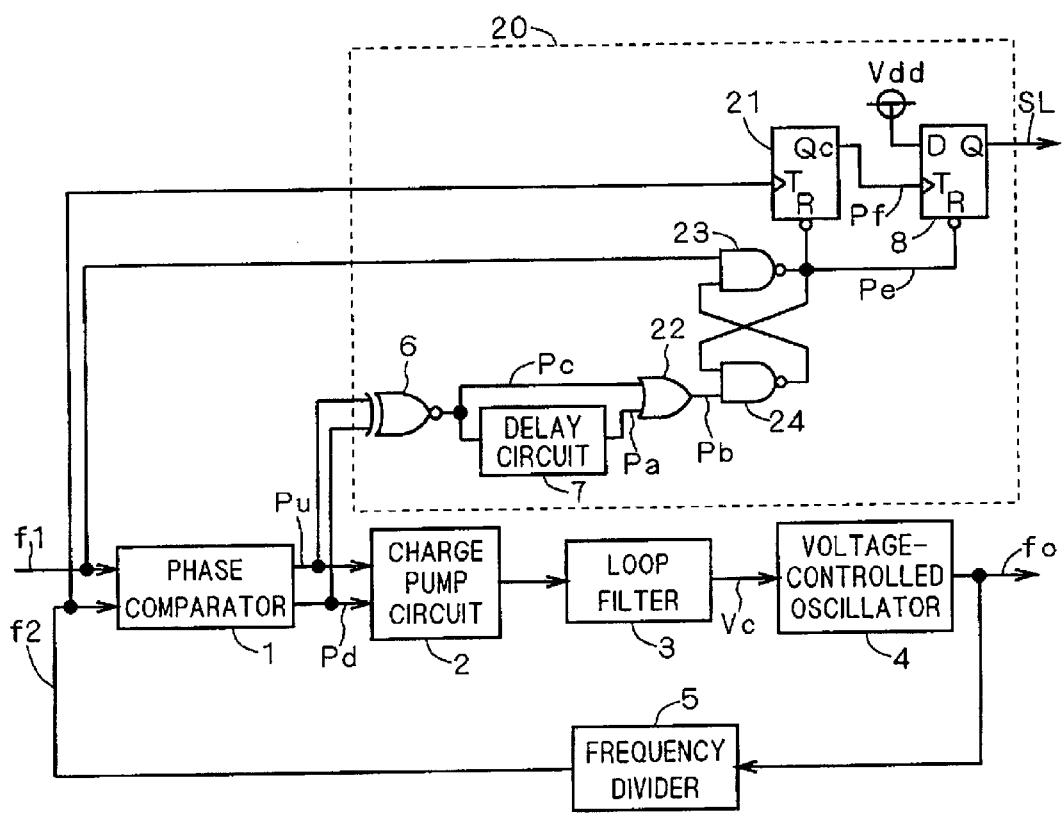
FIG. 2 is a diagram illustrating a modification of the phase locked loop circuit in the first preferred embodiment.

PLL Circuit in FIG. 2

FIG. 2 illustrates a modification of the PLL circuit of the first preferred embodiment. This PLL circuit is different from the PLL circuit of FIG. 1, only in that instead of a feedback signal f2, an input signal f1 is inputted to the NAND circuit 23, and instead of the input signal f1, the feedback signal f2 is inputted to the clock input terminal T of the counter 21.

Operation of PLL Circuit

Figure 3:
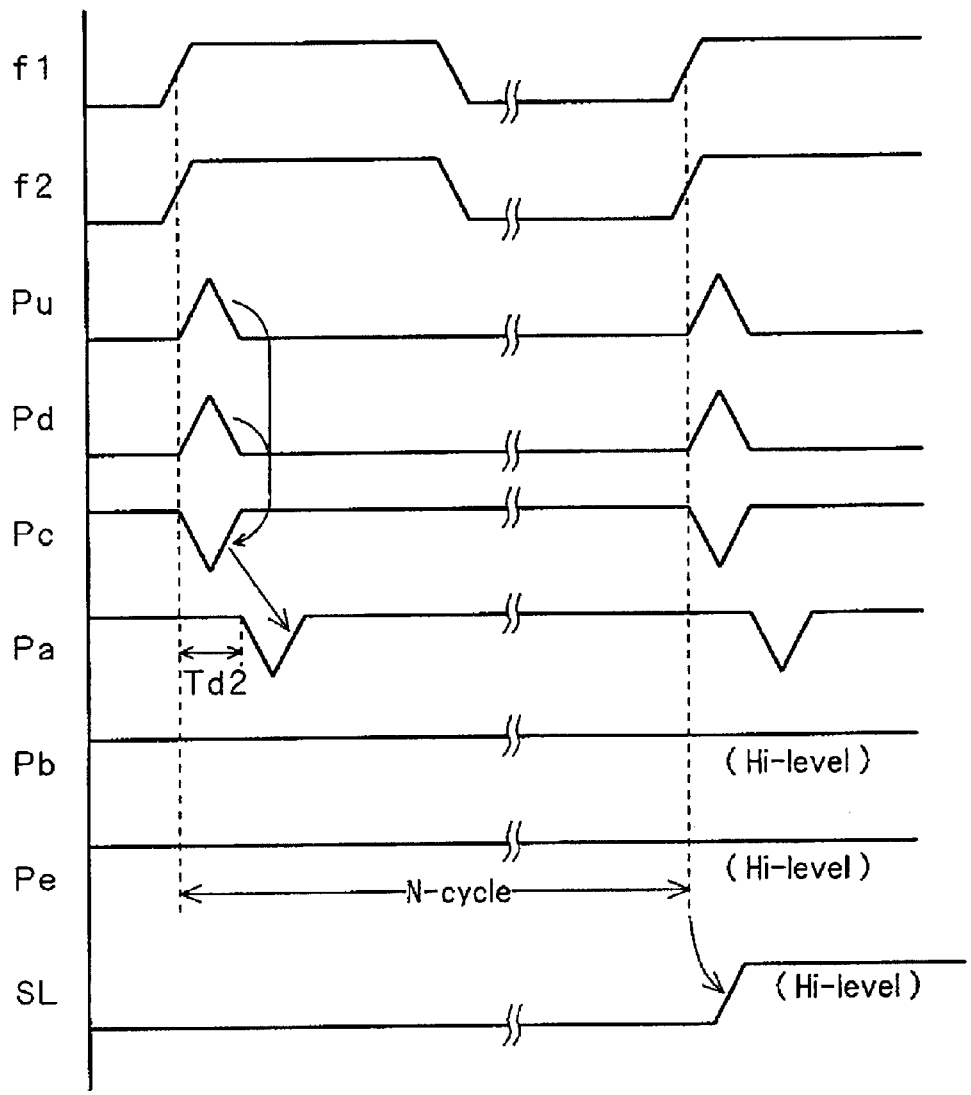
FIG. 3 is a timing chart indicating the signals of respective parts in synchronous state on the phase locked circuit of the first preferred embodiment.
Figure 4:
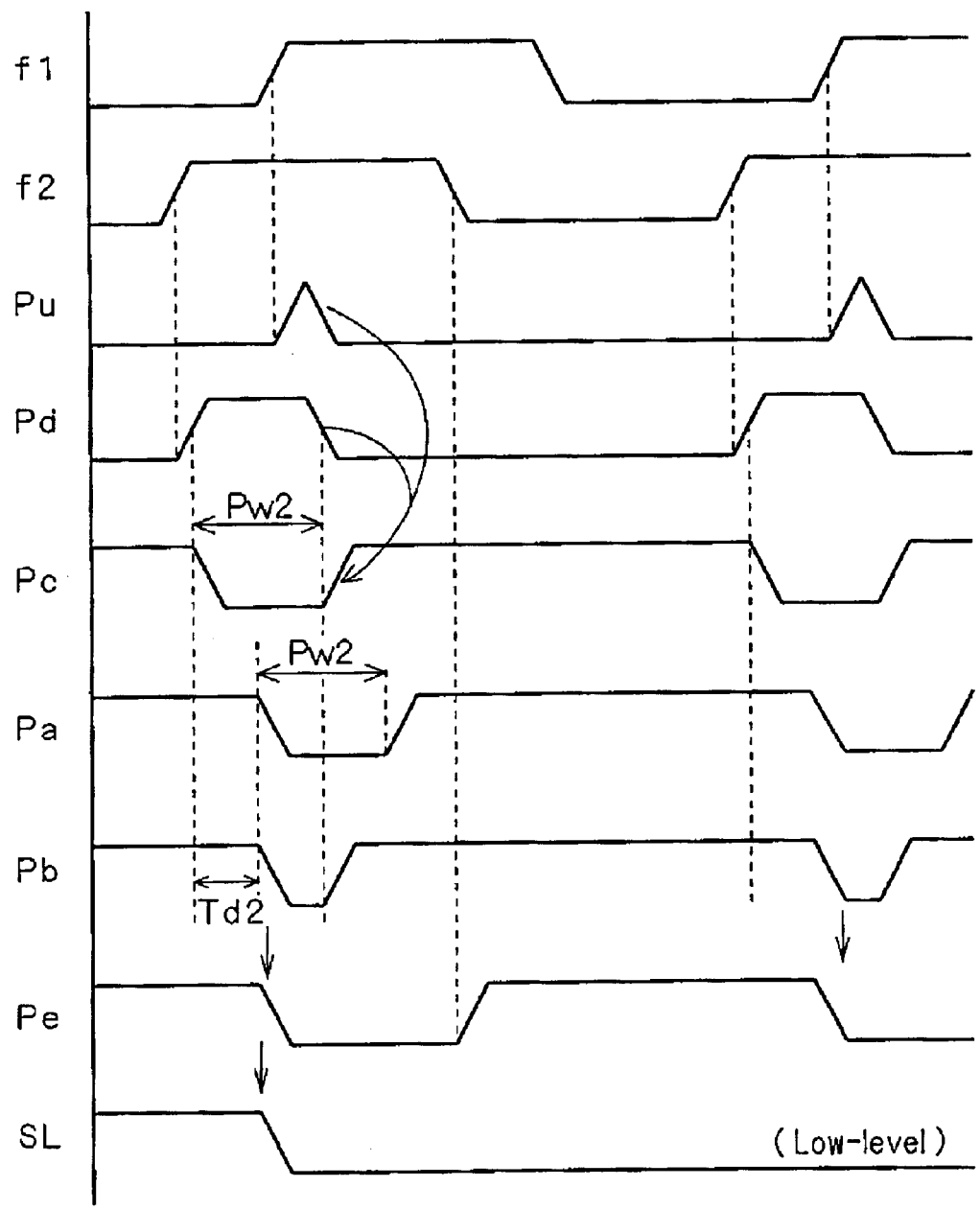
FIGS. 4 and 5 are timing charts indicating the signals of respective parts in asynchronous state on the phase locked circuit of the first preferred embodiment.
Figure 5:
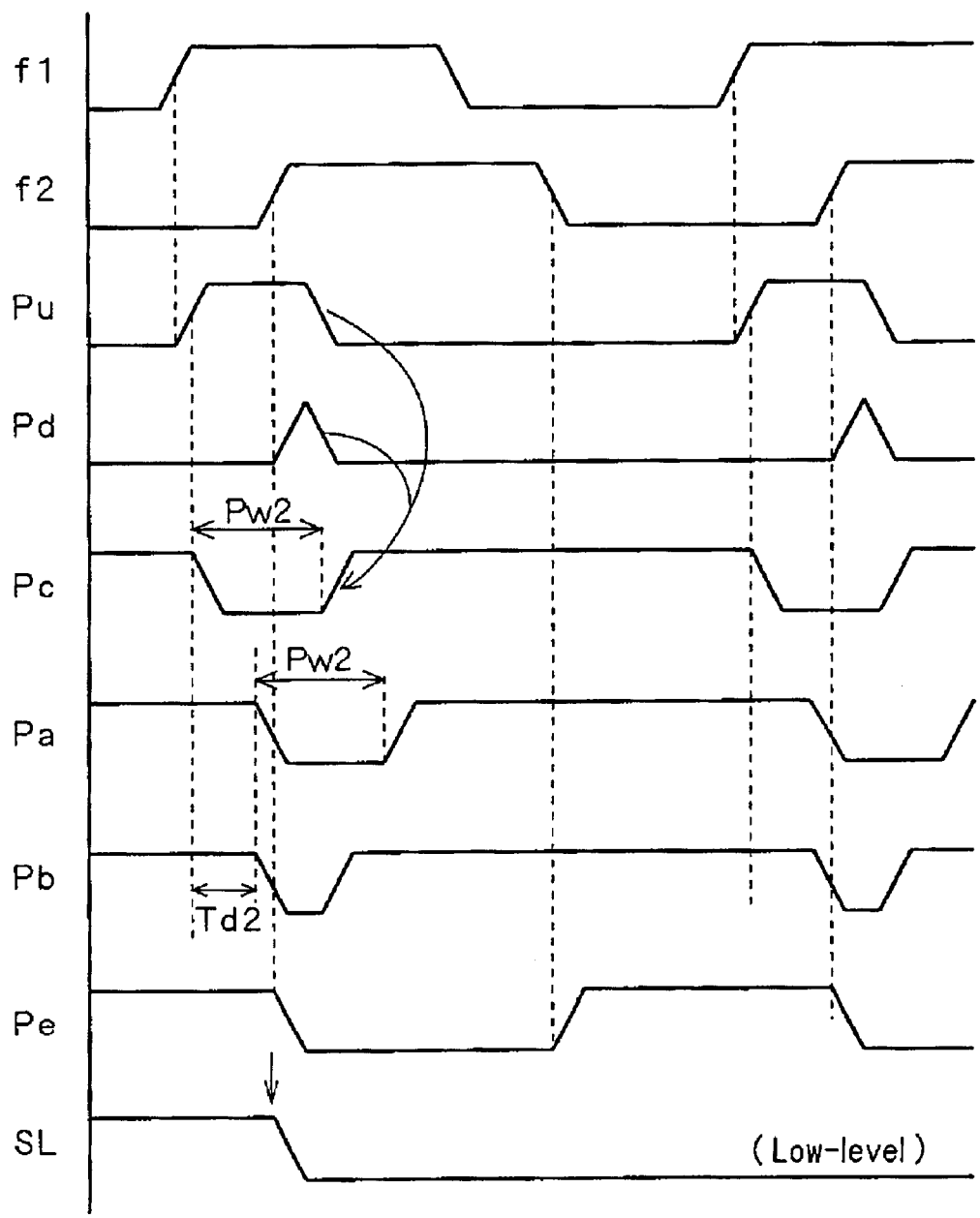

Operation of the PLL circuit of FIG. 1 will now be described by referring to FIGS. 3 to 5. FIGS. 3 to 5 are timing charts indicating the signals of respective parts in synchronous state on this PLL circuit. Specifically, FIG. 3 shows the case that the phase of an input signal f1 substantially coincides with the phase of a feedback signal f2 (namely, a synchronous case), and FIGS. 4 and 5 show the case that the phase of the input signal f1 is behind or ahead of the phase of the feedback signal f2 (namely, an asynchronous case).

By using the output signals Pu and Pd of the phase comparator 1, the exclusive NOR circuit 6 generates and outputs a pulse signal Pc having a pulse width Pw2 corresponding to a phase difference between a feedback signal f2 and an input signal f1, regardless of whether these signals are delayed or not (It can be thought as to be substantially synchronous in FIG. 3, however, assume there is a slight phase difference in the rise of the output signals Pu and Pd). The delay circuit 7 outputs a pulse signal Pa that is behind of the pulse signal Pc by a predetermined time Td2. As apparent from the pulse signals Pa and Pc in FIGS. 3 to 5, the pulse signals Pa and Pc reflect the pulse wave-form of one having a longer pulse width in the output signals Pu and Pd that are the comparison result of the phase comparator 1.

The OR circuit 22 carries out OR operation of pulse signals Pa and Pc, and outputs an output signal Pb. Therefore, in the case of substantially synchronous state as shown in FIG. 3, the output signal Pb is not activated because the pulse signals Pa and Pc are not in "Low" state at the same time (herein, assuming the output signal Pb be in "Low-active"). Of course, depending on the set value of a delay time Td2, it is adjustable that both of the pulse signals Pa and Pc become "Low".

On the other hand, in the case of asynchronous state as shown in FIGS. 4 and 5, the output signal Pb is activated only in such a period of time that the pulse signals Pa and Pc are both in "Low" state.

NAND latch circuit formed by the NAND circuits 23 and 24 has the function of latching the activated output signal Pb until the feedback signal f2 falls, as shown in FIGS. 4 and 5. When the feedback signal f2 transits to "Hi" level under the situation that the feedback signal f2 is in "Low" level and the output signals Pb and Pe are in "Hi" level, as shown in FIG. 5, the NAND latch circuit latches, due to its characteristic, the output signal Pb at the time of transition of the feedback signal f2. However, the start of latch is merely before and after the transition of the output signal Pb, and there is no change in the function of latching the activated output signal Pb.

A reset signal Pe outputted from the NAND latch circuit is "Low-active" and, when it changes to "Low" level, the outputs of the counter 21 and D-FF circuit 8 are reset. That is, as shown in FIGS. 4 and 5, if a lock detecting signal SL is already activated (taking the lock detecting signal SL as "Hi-active"), the lock detecting signal SL is deactivated by the transition of the reset signal Pe.

The counter 21 activates output when the oscillation number of the input signal f1 reaches N(>0). As shown in FIG. 3, unless any reset occurs during N-cycle, for the first time the D-FF circuit 8 can receive the output signal Pf from the counter 21, thereby to activate the lock detecting signal SL.

Referring now to FIG. 2, in the operation of the PLL circuit, only the functions of the input signal f1 and a feedback signal f2 to the lock detector 20 are reversed. In the timing charts of FIGS. 3 to 5, merely reversed are points that each transition resulting from the signal change of the input signal f1 is caused by the signal change of the feedback signal f2, and that each transition resulting from the signal change of the feedback signal f2 is caused by the signal change of the input signal f1.

Characteristic Functions

The foregoing might be summarized as follows. The lock detector 20 can be interpreted by dividing it into three parts: (i) a reset signal output part that activates a reset signal Pe when the phase difference between two pulse signals that repeat oscillation (namely, an input signal f1 and a feedback signal f2) is not less than a predetermined value; (ii) a signal output part that does not activate a lock detecting signal SL indicating the synchronization of the two pulse signals, when the reset signal is activated; and (iii) a counter that counts the oscillation number of either of the two pulse signals and activates output when the count number reaches N(>0), and also resets the count number when the reset signal is activated.

The reset signal output part can further be divided into a phase-difference detecting part that activates a phase-difference detecting signal when the phase difference between the two pulse signals is detected; and a latch circuit that latches the phase-difference detecting signal for a predetermined time and outputs it as a reset signal. The phase-difference detecting part is made up of the exclusive NOR circuit 6, delay circuit 7, and OR circuit 22. The latch circuit is the NAND latch circuit formed by the NAND circuits 23 and 24. The phase-difference detecting signal is the output signal Pb, and the reset signal is the output signal Pe.

The signal output part is the D-FF circuit 8, and the counter is the counter 21.

Effects

From this interpretation, the lock detector 20 on the PLL circuit of the first preferred embodiment has the following effects.

Specifically, when the phase difference between two pulse signals is not less than a predetermined value, a reset signal Pe is activated whereas a lock detecting signal SL is not activated. In the first preferred embodiment, in order that the activated signal Vdd is always applied to the signal input terminal D of the D-FF circuit 8, it is arranged such that the signal output part activates, in principle, a lock detecting signal unless the reset signal is activated. As a result, there is no possibility that the signal output part erroneously outputs the content of the lock detecting signal as asynchronous, when the phases of the two pulse signals are synchronized with each other.

Accordingly, even if the phase difference between the two pulse signals is slight, there is no possibility that the D-FF circuit 8 holds the lock detecting signal SL at "Low" level and outputs incorrect content as a lock detecting signal, as previously described in the first problem to be solved by the invention.

Assume that at least one of two pulse signals is a continuous pulse signal that repeats oscillation without interruption, and activation of a reset signal is based on the continuous pulse signal. Even if the other signal that is not a continuous pulse signal stops suddenly, and the phase difference therebetween increases continuously, the reset signal can reliably be activated. Thus, there is no possibility that the content of a lock detecting signal is erroneously and continuously outputted as synchronous.

This will fully be described by using the PLL circuit of FIG. 1. Since the feedback signal f2 is a pulse signal generated on the voltage-controlled oscillator 4, the feedback signal f2 is a continuous pulse signal that repeats oscillation without interruption. Therefore, in the state that the feedback signal f2 is already inputted to the input terminal of the NAND latch circuit, even if the input signal f1 stops suddenly in the timing chart of FIG. 4, for example, the phase difference detecting signal Pb can be reliably outputted based on the signal change of the feedback signal f2, thereby deactivating the lock detecting signal SL. Also, in the case of the timing chart of FIG. 5, a sudden stop of the input signal f1 can be considered to be identical with that the phase of the input signal f1 is behind of the feedback signal f2 with infinite phase difference. Eventually, this case is similar to that in FIG. 4.

That is, the reset signal Pe can reliably be activated, and there is no possibility that the content of the lock detecting signal is erroneously and continuously outputted as synchronous.

As apparent from the timing charts of FIGS. 4 and 5, the configuration of the first preferred embodiment is capable of returning the reset signal Pe to deactivate state in one cycle, by the fall of the feedback signal f2. This also enables to quickly resume lock detection when the stopped input signal f1 returns.

On the lock detector 20, the latch circuit latches for a predetermined period of time a phase-difference detecting signal (Pb) from the phase-difference detecting part. Therefore, even when the phase difference is slight and the phase-difference detecting signal is activated by the phase-difference detecting part only for a short period of time, it is capable of latching and enlarging the activated period of the phase-difference detecting signal, thereby to prevent that the signal output part fails to recognize the reset signal.

Further, a phase-difference input signal is inputted to the phase-difference detecting part on the lock detector 20. The phase-difference input signal performs activation when one of the two pulse signals causes a signal change in a predetermined direction (i.e., rise or fall), and performs deactivation when the other causes a signal change in the same direction.

As used herein, the phase-difference input signal designates one of the output signals Pu and Pd to be inputted to the exclusive NOR circuit 6, which signal has a longer pulse width. The exclusive NOR circuit 6, in substance, merely selects one having a large pulse width in the output signals Pu and Pd. Therefore, the pulse signal Pc can be considered to correspond to the mentioned phase-difference input signal.

When an active period Pw2 of the pulse signal Pc that is the phase-difference input signal is shorter than a delay time Td2, the phase-difference detecting signal (Pb) is not activated, as can be seen from FIGS. 4 and 5.

Therefore, no activation of the reset signal is performed when the active period of the pulse signal Pc that is the phase-difference input signal is such slight as to be shorter than the delay time Td2 (i.e., to such a degree that the two pulse signals can be considered as to be synchronous). When the phases of the two pulse signals are in synchronization, the reset signal is not activated, and there is no possibility that the content of a lock detecting signal is erroneously outputted as asynchronous.

On the lock detector 20, the output signal Pf of the counter 21 is being inputted as the clock of the D-FF circuit 8. Therefore, when the output from the counter is activated, a lock detecting signal can be activated in the signal output part.

Thereby, if the reset signal is activated before reaching N-cycle, the lock detecting signal is not activated. As a result, activation of the lock detecting signal is avoidable when the two pulse signals approach synchronization while oscillating, and if frequency and phase coincide momentarily during this progress. Therefore, no lock detecting signal erroneously indicating synchronous is outputted on such a stage that synchronization is incomplete.

Second Preferred Embodiment

Figure 6:
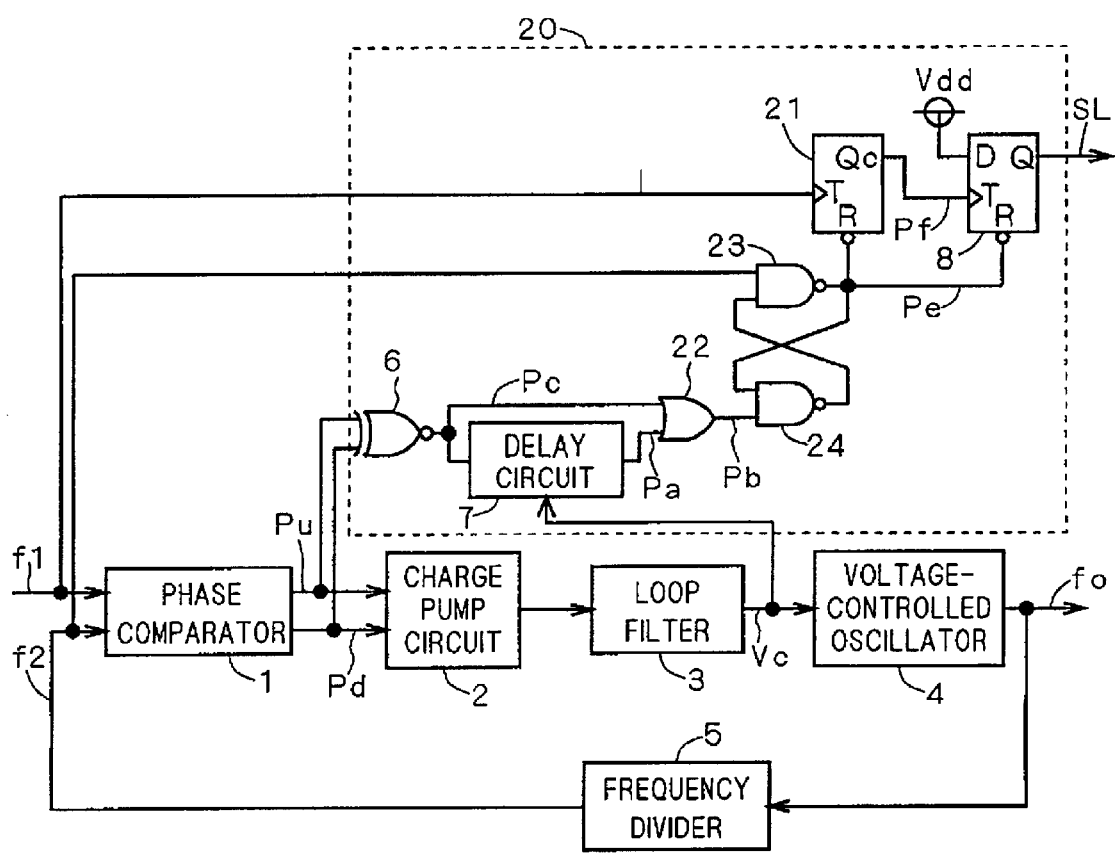
FIG. 6 is a diagram illustrating a phase locked loop circuit according to a second preferred embodiment of the invention.

A second preferred embodiment is a modification of the PLL circuit of the first preferred embodiment. Like the conventional PLL circuit shown in FIG. 18, an analog voltage signal Vc outputted from a loop filter 3 is inputted to a delay circuit 7 of a lock detector 20. FIG. 6 is a diagram of a PLL circuit according to the second preferred embodiment. The same references have been retained for similar parts, which have the same functions as the PLL circuit of the first preferred embodiment.

The delay circuit 7 is formed by a ring counter, for example. An analog voltage signal Vc from the loop filter 3 is applied to the ring counter. The delay amount of respective delay stages forming the ring counter changes depending on the value of the analog voltage signal Vc.

Otherwise, the configuration is the same as that of the PLL circuit of the first preferred embodiment, and its description is therefore omitted.

With this configuration that the analog voltage signal Vc controls the delay amount of respective delay stages of the delay circuit 7, the criterion of lock detection can be set to a certain rate with respect to the frequency of an input signal f1, by establishing a suitable correlation between the frequency of the input signal f1 and the delay amount on the delay circuit 7. For example, with such a construction that the delay amount on the delay circuit 7 is decreased if the input signal f1 has a high frequency, and that the delay amount on the delay circuit 7 is increased if the input signal f1 has a low frequency, more precise phase-difference detection can be performed with respect to the input signal f1 of high frequency.

Third Preferred Embodiment

A third preferred embodiment is also a modification of the PLL circuit of the first preferred embodiment. In this modification, an OR circuit and a NAND circuit are used in place of the exclusive NOR circuit 6 and the OR circuit 22 in the first preferred embodiment.

Figure 7:
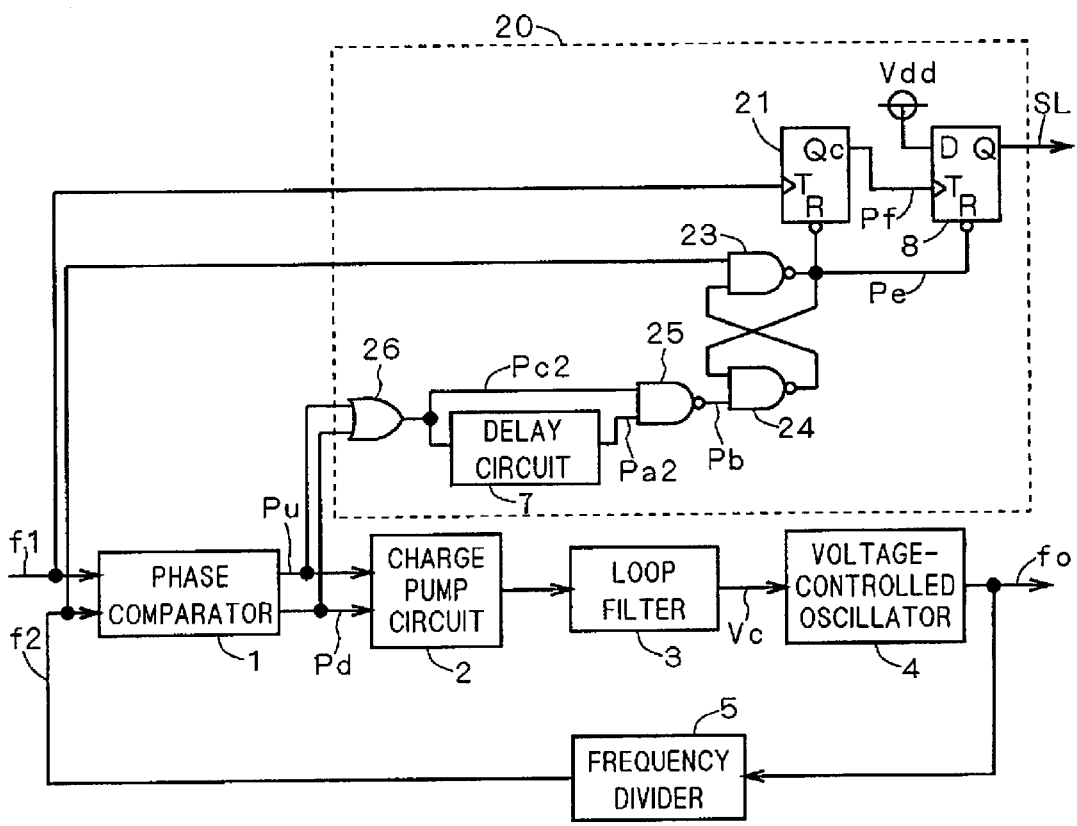
FIG. 7 is a diagram illustrating a phase locked loop circuit according to a third preferred embodiment of the invention.

FIG. 7 is a diagram of a PLL circuit according to the third preferred embodiment. The same references have been retained for similar parts, which have the same functions as the PLL circuit of the first preferred embodiment. On the PLL circuit of the third preferred embodiment, an OR circuit 26 is disposed instead of the exclusive NOR circuit 6, and an NAND circuit 25 is disposed instead of the OR circuit 22. The output signal of the OR circuit 26 is taken as Pc2, and the output signal of the delay circuit 7 is taken as Pa2. Otherwise, the configuration is the same as that of the first preferred embodiment, and its description is therefore omitted.

Figure 8:
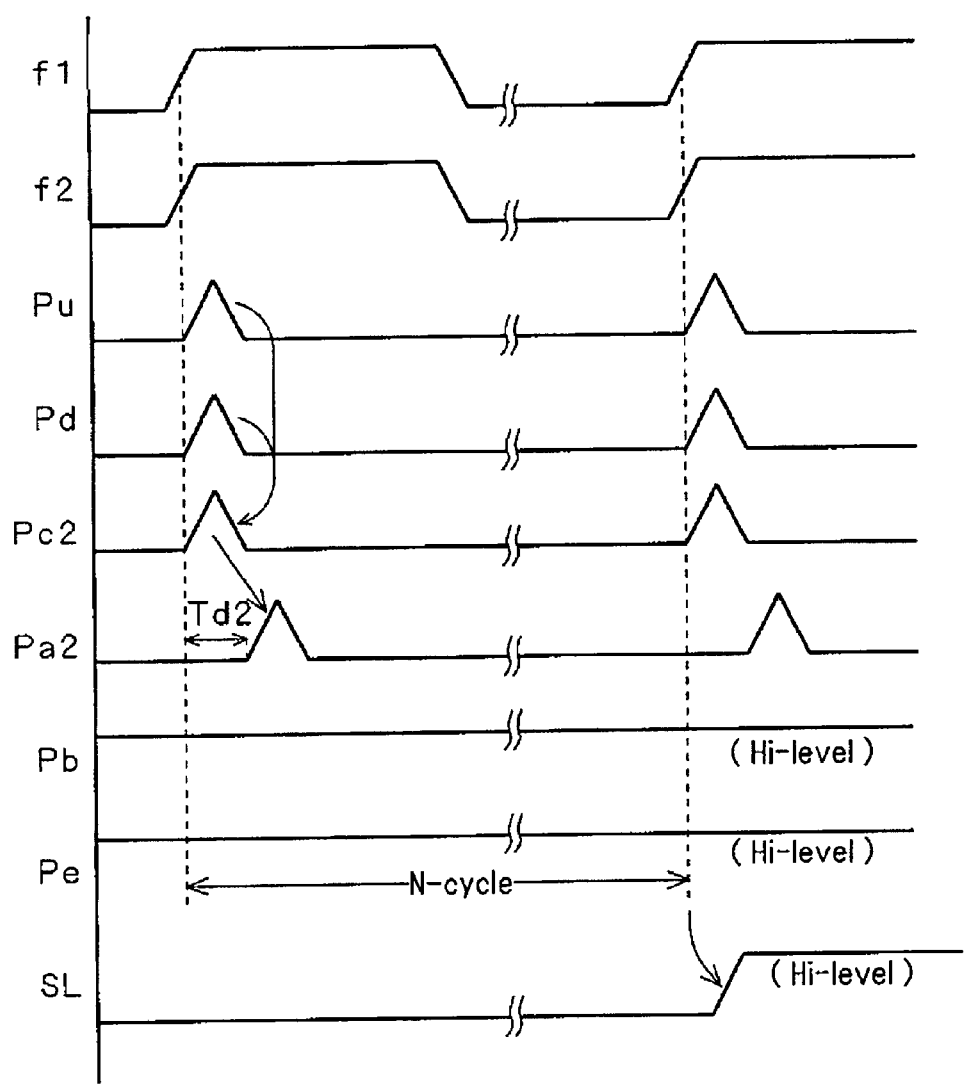
FIG. 8 is a timing chart indicating the signals of respective parts in synchronous state on the phase locked circuit of the third preferred embodiment.
Figure 10:
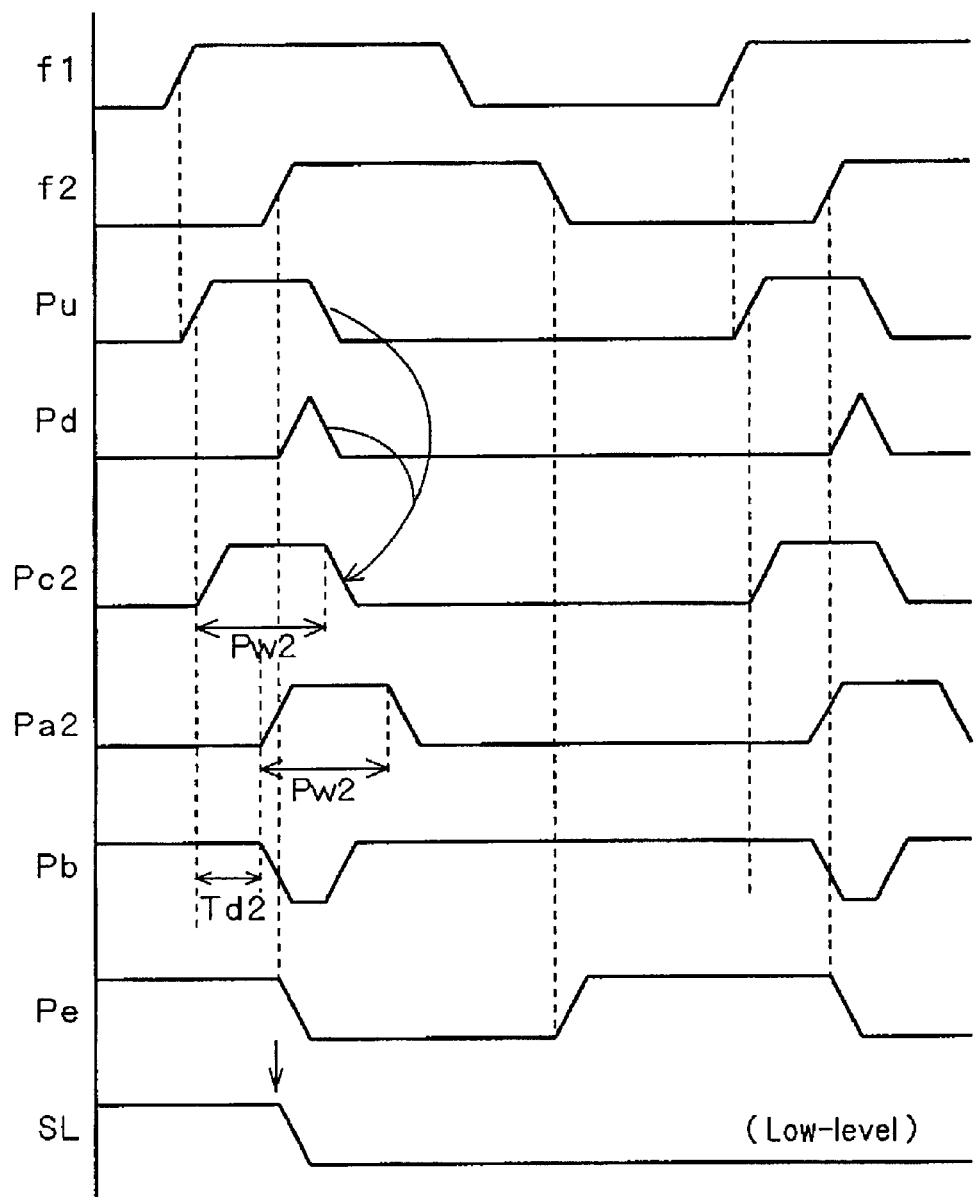

Operation of the PLL circuit of the third preferred embodiment will next be described by referring to FIGS. 8 to 10. FIGS. 8 to 10 are timing charts of signals in respective parts of this PLL circuit.

As can be seen from FIGS. 8 to 10, these figures correspond to FIGS. 3 to 5, respectively, which illustrate the timing charts in the first preferred embodiment, but differ only in replacing the pulse signals Pc and Pa with the pulse signals Pc2 and Pa2, which are obtained by reversing in "Hi" and "Low".

Accordingly, the PLL circuit of the third preferred embodiment has the same effect as the PLL circuit of the first preferred embodiment.

Since the OR circuit 26 can be formed by less number of transistors than the exclusive NOR circuit 6, the area occupied in forming the lock detector 20 on the circuit substrate can be reduced.

Fourth Preferred Embodiment

A fourth preferred embodiment is a modification of the PLL circuit of the third preferred embodiment. In this modification, there are disposed an AND circuit that is an output control part capable of controlling whether a feedback signal f2 is outputted or not, and a switch by which a signal applied to an NAND circuit 23 is selected from an input signal f1 and a feedback signal f2.

For the purpose of standby mode, test or the like, such a PLL circuit that an output signal fo is temporarily fixed to "Low" level is often used. According to the fourth preferred embodiment, such a function is added to the PLL circuit of the third preferred embodiment.

FIG. 11 is a diagram of a PLL circuit according to the fourth preferred embodiment. The same references have been retained for similar parts, which have the same functions as the PLL circuit of the third preferred embodiment.

Referring to FIG. 11, there is disposed an AND circuit 14. An output signal fo outputted from a voltage-controlled oscillator 4 is applied to one of input terminals of the AND circuit 14. It is therefore capable of determining whether the output signal fo should be applied to a frequency divider 5, based on an output control signal E to be applied to the other input terminal of the AND circuit 14.

Also, there is disposed a switch 15 that is capable of selecting and outputting either of an input signal f1 and a feedback signal f2 by using a control signal S. By applying its output to a NAND circuit 23, the signal applied to the NAND circuit 23 can be selected from the input signal f1 and feedback signal f2.

Otherwise, the configuration is the same as that of the PLL circuit of the third preferred embodiment, and its description is therefore omitted.

In the fourth preferred embodiment, in the case that on receipt of Hi-state (assuming "Hi-active") of an output control signal E, the AND circuit 14 applies an output signal fo to the frequency divider 5, and outputs a feedback signal f2, the switch 15 outputs the feedback signal f2 by using a control signal S linked to the output control signal E.

Whereas, in the case that on receipt of Low-state of the output control signal E, the AND circuit 14 does not apply the output signal fo to the frequency divider 5, and it does not output the feedback signal f2, the switch 15 outputs the input signal f1 by using the control signal S linked to the output control signal E.

With this construction, the signal change of a reset signal Pe on the NAND latch circuit is controlled by the input signal f1 or feedback signal f2, which is the output of the switch 15.

For instance, by arranging such that the feedback signal f2 is outputted from the switch 15 when the PLL circuit performs the normal operation, and the feedback signal f2, which is a continuous pulse that repeats oscillation without interruption, can be used for the signal change of the reset signal Pe.

With such an arrangement that the user can apply an output control signal E if desired to stop the operation of the PLL circuit for the purpose of operation test, standby mode, etc., the input signal f1 can be utilized in the signal change of the reset signal Pe by using the output control signal E and control signal S.

Fifth Preferred Embodiment

A fifth preferred embodiment is also a modification of the third preferred embodiment. This modification is characterized in that a counter 21 is omitted and another frequency divider for dividing an output signal fo is substituted for the counter 21.

Figure 12:
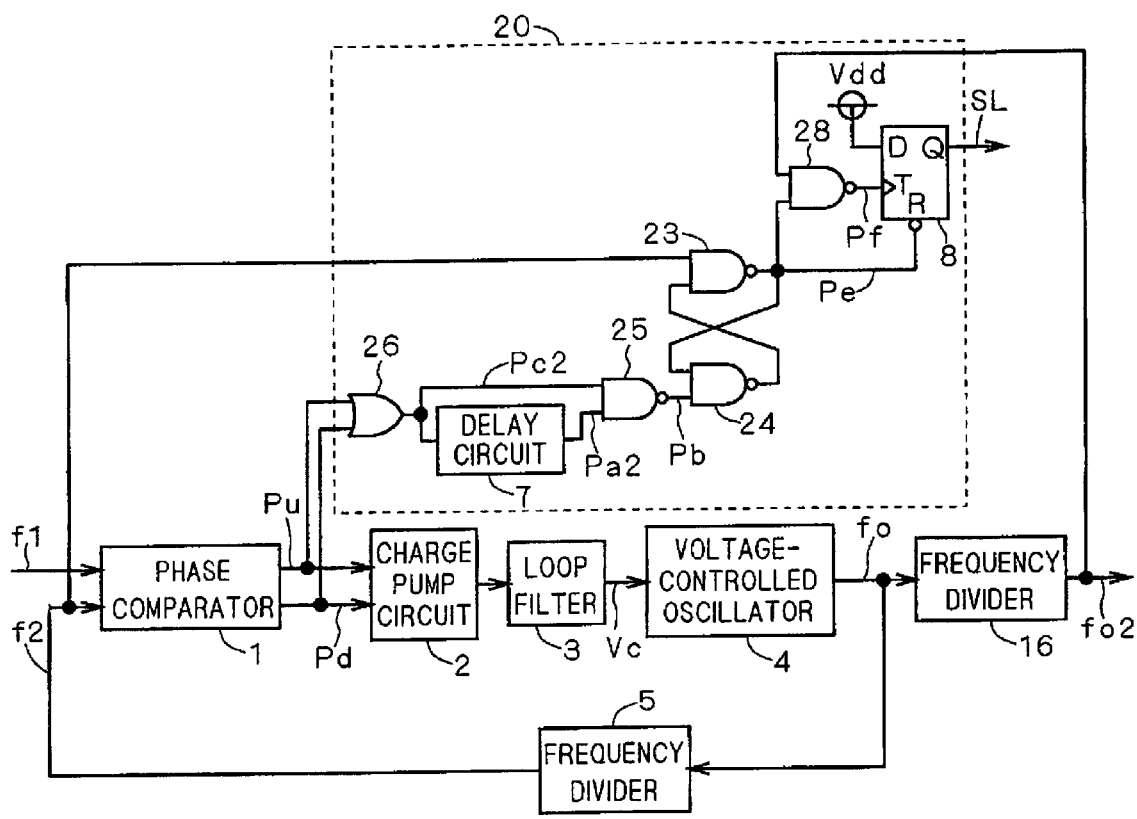
FIG. 12 is a diagram illustrating a phase locked loop circuit according to a fifth preferred embodiment of the invention.

FIG. 12 is a diagram of a PLL circuit according to the fifth preferred embodiment. Referring to FIG. 12, on this PLL circuit, a NAND circuit 28 is disposed in place of the counter 21, and a frequency divider 16 for dividing an output signal fo is added. A reset signal Pe is applied to one input terminal of the NAND circuit 28, and an output signal fo2 of the frequency divider 16 is applied to the other input terminal.

In FIG. 12, the same references have been retained for similar parts, which have the same functions as the PLL circuit of the third preferred embodiment. Otherwise, the configuration is the same as that of the third preferred embodiment, and its description is therefore omitted.

The advantages resulting from the above configuration are as follows. For the use of a clock synthesizer or the like, there is often employed a PLL circuit on which besides the frequency divider 5, another frequency divider is disposed to divide and output the signal of the voltage-controlled oscillator 4. Therefore, the added frequency divider is allowed to function as the counter 21, and a region on the substrate where the counter 21 should be formed can be omitted to reduce the area occupied by the circuit.

When the frequency divider 16 has a dividing ratio that satisfies N×M≦L, (M is the dividing ratio of the frequency divider 5, L is the dividing ratio of the frequency divider 16, and N is the count number of the counter circuit 21 in FIG. 7), the same operation as that of the PLL circuit shown in FIGS. 1 and 7 can be realized.

For instance, when the frequency of an output signal fo is 100 MHz, the dividing ratio of the frequency divider 16 is 100, the dividing ratio of the frequency divider 5 is 10, and the count number obtained by the counter circuit 21 is 10, the frequency of an output signal fo2 is 1 MHz, and the frequency of a feedback signal f2 is 10 MHz. At this time, if a reset signal Pe repeats a continuous activation throughout each cycle, its frequency becomes 10 MHz according to the frequency of the feedback signal f2. This results in that on the NAND circuit 28, AND between the output signal fo2 having the frequency of 1 MHz and the reset signal Pe having the frequency of 10 MHz, is operated and inverted for output, thereby inputting ten pulses in total to the D-FF circuit 8.

Hereat, with the setting such that a lock detecting signal SL is outputted from the D-FF circuit 8 when the clock input terminal of the D-FF circuit 8 detects a signal having a pulse width of not less than 10 times of 10-MHz pulse (this figure reflects that the count number is 10), the lock detecting signal SL is arranged to be outputted for the first time, under the condition that the reset signal Pe continues holding the non-active state (Hi level) with the pulse width of not less than 10-times pulses.

That is, operation similar to that of the PLL circuit shown in FIGS. 1 and 7 can be realized when the above condition of N×M≦L is satisfied.

Thus, the frequency divider 16 can be used as a counter by arranging such that the output of the frequency divider 16 and the reset signal Pe are inputted, and the NAND circuit 28, which is a gate circuit performing logical operation of the two, controls activation of the lock detecting signal SL on the D-FF circuit 8 serving as a signal output part.

Thereby, a region on a substrate where a counter should be formed can be omitted to reduce the area occupied by the circuit.

Sixth Preferred Embodiment

A sixth preferred embodiment is also a modification of the PLL circuit of the third preferred embodiment. This modification is characterized by outputting two comparison result signals having different pulse widths, in place of the phase comparator 1 outputting phase-difference output signals Pu and Pd.

Figure 13:
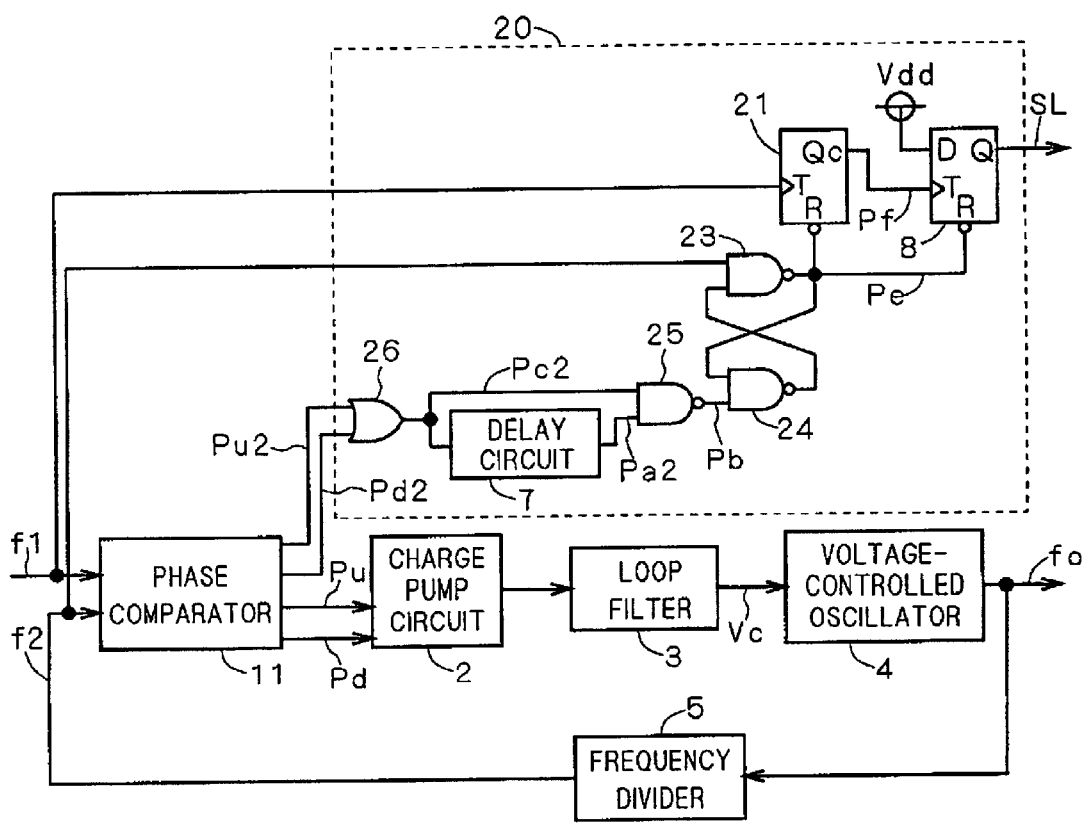
FIG. 13 is a diagram illustrating a phase locked loop circuit according to a sixth preferred embodiment of the invention.

FIG. 13 is a diagram illustrating a PLL circuit of the sixth preferred embodiment. The same references have been retained for similar parts, which have the same functions as the PLL circuit of the third preferred embodiment.

Referring to FIG. 13, this PLL circuit employs, instead of the phase comparator 1, a phase comparator 11 from which two pairs of output signals Pu and Pd, and output signals Pu2, Pd2 are outputted. The output signals Pu and Pd, which are the same as that of the PLL circuit of the third preferred embodiment, are inputted only to a charge pump circuit 2 of the PLL circuit, not to a lock detecting circuit 20. The output signals Pu2 and Pd2 are inputted only to both input terminals of an OR circuit 26 of the lock detector 20, not to the charge pump circuit 2. Otherwise, the configuration is the same as the PLL circuit of the third preferred embodiment, and its description is thus omitted.

Figure 14:
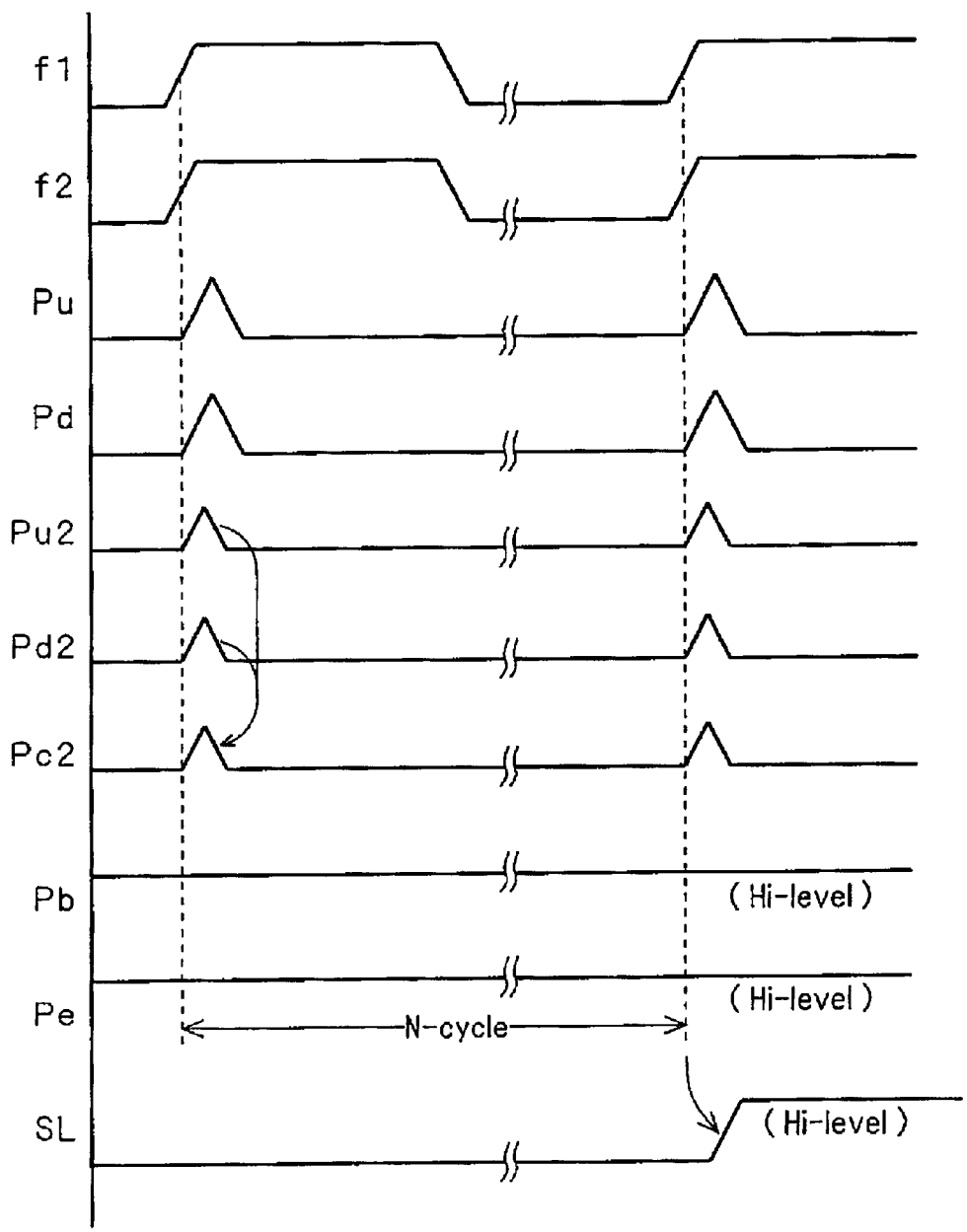
FIG. 14 is a timing chart indicating the signals of respective parts in synchronous state on the phase locked circuit of the sixth preferred embodiment.
Figure 15:
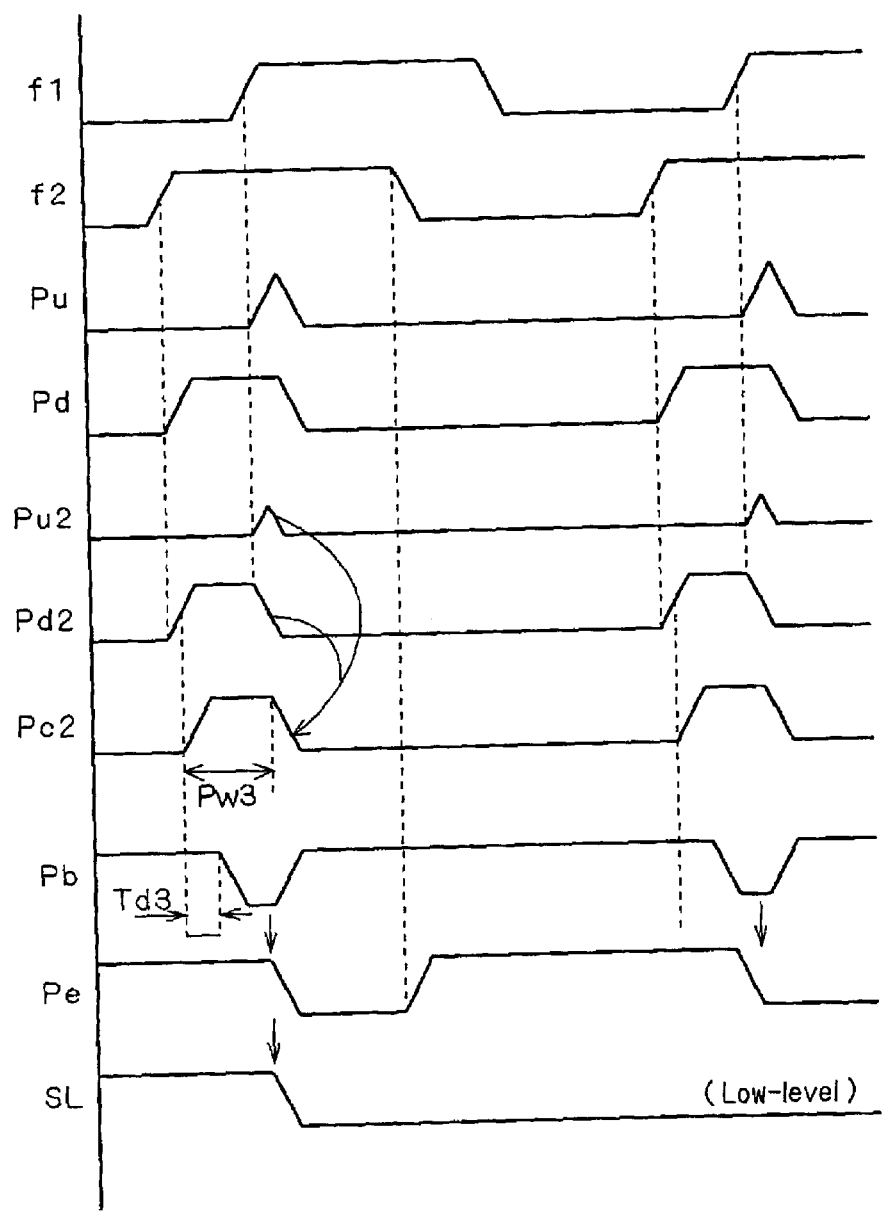
FIGS. 15 and 16 are timing charts indicating the signals of respective parts in asynchronous state on the phase locked circuit of the sixth preferred embodiment.
Figure 16:
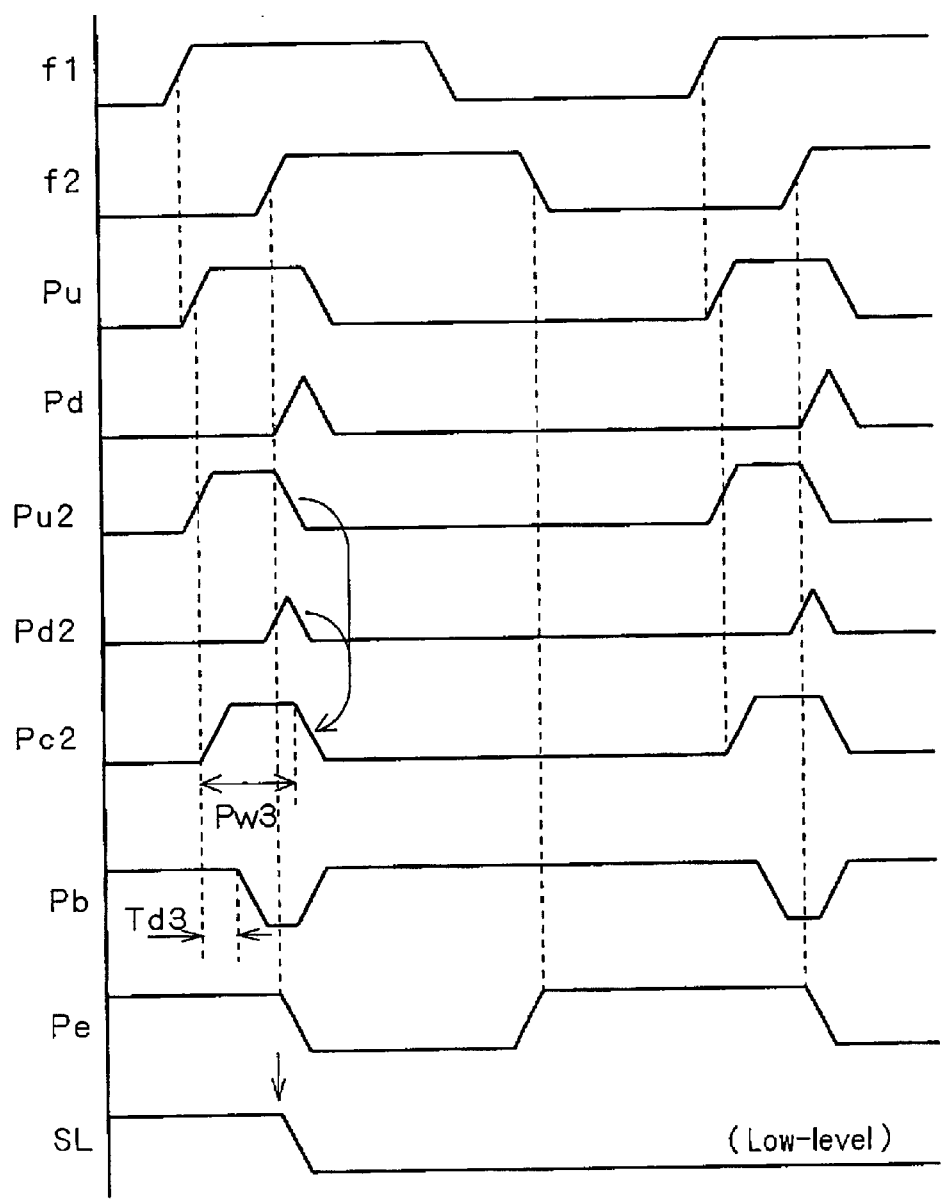

Operation of the PLL circuit of the sixth preferred embodiment will next be described by referring to FIGS. 14 to 16. FIGS. 14 to 16 are timing charts of signals in respective parts of this PLL circuit.

As can be seen from FIGS. 14 to 16, these figures correspond to FIGS. 8 to 10 illustrating the timing charts in the third preferred embodiment, respectively, but differ only in that the signal change of the pulse signals Pu2 and Pd2, of which pulse width is different from that of the output signals Pu and Pd, contributes to generation of a pulse signal Pc2 (and Pa2).

The advantages resulting from this configuration are as follows. Referring to FIGS. 15 and 16, pulse width Pw3 of the pulse signal Pc2 can be reduced by setting such that the pulse width of the output signals Pu2 and Pd2 is shorter than that of the output signals Pu and Pd. Thereby, more accurate phase-difference detection can be performed by setting delay amount Td3 on a delay circuit 7 to a small value when generating the output signal Pb as a phase-difference detecting signal in a phase-difference detecting part formed by OR circuit 26, delay circuit 7 and NAND circuit 25. Setting the delay amount Td3 on the delay circuit 7 to a small value means to reduce the number of delay stages of the delay circuit 7, without changing the phase characteristic of an input signal to the charge pump circuit 2. It is therefore able to reduce a region on the substrate where the delay circuit should be formed, thus reducing the area occupied by the circuit.

Figure 17:
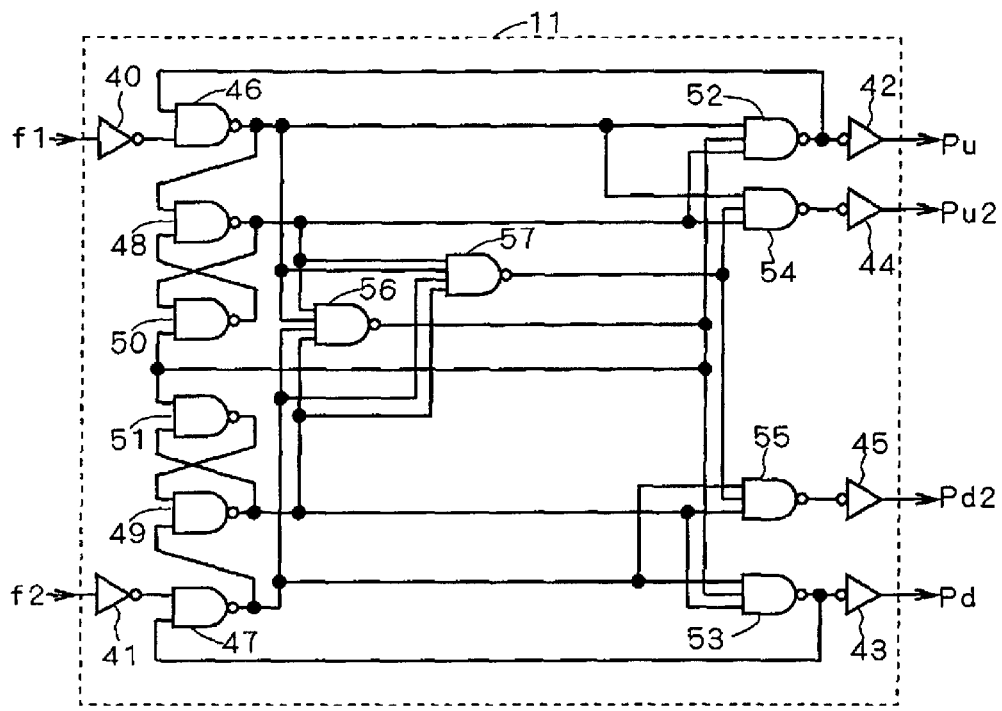
FIG. 17 is a diagram illustrating a phase comparator of the phase locked loop circuit of the sixth preferred embodiment.

FIG. 17 illustrates a configuration of the phase comparator 11. In addition to the parts of the phase comparator of FIG. 21, there are disposed inverter circuits 44 and 45, three-input NAND circuits 54 and 55, and a four-input NAND circuit 57 which have the same input/output configuration as the inverter circuits 42 and 43, three-input NAND circuits 52 and 53, and four-input NAND circuit 56, respectively.

The three-input NAND circuits 54 and 55 perform the same logical operation as the three-input NAND circuits 52 and 53. The inverter circuits 44 and 45 perform the same logical operation as the inverter circuits 42 and 43. The four-input NAND circuit 57 performs the same logical operation as the four-input NAND circuit 56. The inverter circuits 44 and 45 generate output signals Pu2 and Pd2 of the phase comparator 11.

In order to set the pulse width of the output signals Pu2 and Pd2 so as to be shorter than that of the output signals Pu and Pd, for example, the delay time from input to output of the four-input NAND circuit 57 may be set to be smaller than the delay time from input to output of the four-input NAND circuit 56.

While the invention has been shown and described in detail, the foregoing description is in all aspects illustrative and not restrictive. It is therefore understood that numerous modifications and variations can be devised without departing from the scope of the invention.

What is claimed is:

1. A lock detector comprising:
    a reset signal output part to activate a reset signal when there is a phase difference of not less than a predetermined value between first and second pulse signals that repeat oscillation; and
    a signal output part that outputs a lock detecting signal indicating synchronization of said first and second pulse signals and deactivates said lock detecting signal when said reset signal is activated, wherein said reset signal output part includes;

a phase-difference detecting part to activate a phase-difference detecting signal when detecting said phase difference between said first and second pulse signals; and a latch circuit that latches said phase-difference detecting signal for a predetermined period of time and outputs it as said reset signal.

2. The lock detector according to claim 1, wherein at least one of said first and second pulse signals is a continuous pulse signal that repeats oscillation without interruption; and the activation of said reset signal is based on the signal change of said continuous pulse signal.

3. The lock detector according to claim 1, wherein a phase-difference input signal is inputted to said phase-difference detecting part, said phase-difference input signal being activated by a predetermined-direction signal change of one of said first and second pulse signals and being deactivated by said predetermined-direction signal change of the other signal of said first and second pulse signals; and said phase-difference detecting part deactivates said phase-difference detecting signal when an activation period of said phase-difference input signal is shorter than said predetermined value of said phase-difference.

4. The lock detector according to claim 3, wherein said phase-difference detecting part includes:

a delay circuit to delay said phase-difference input signal; and a gate circuit that operates OR or reverses AND of said phase-difference input signal and an output of said delay-circuit, and outputs its result as said phase-difference detecting signal.

5. The lock detector according to claim 4, wherein to said reset signal output part, there are inputted:

a first input signal being activated by a predetermined-direction signal change of one of said first and second pulse signals and being deactivated by said predetermined-direction signal change of the other signal of said first and second pulse signals; and a second input signal being activated by said predetermined-direction signal change of said the other of said first and second pulse signals and subsequently being deactivated quickly, said lock detector further including:

an exclusive NOR circuit that operates an exclusive NOR of said first and second input signals and outputs its operation result as said phase-difference input signal, and wherein said gate circuit is an OR circuit; and said phase-difference detecting signal is not activated when the activation period of said phase-difference input signal is shorter than said predetermined value of said phase difference.

6. The lock detector according to claim 4, wherein to said reset signal output part, there are inputted:

a first input signal being activated by a predetermined-direction signal change of one of said first and second pulse signals and being deactivated by said predetermined-direction signal change of the other signal of said first and second pulse signals; and a second input signal being activated by said predetermined-direction signal change of said the other of said first and second separate pulse signals and subsequently being deactivated quickly, said lock detector further including:

an OR circuit that operates an OR of said first and second input signals and outputs its operation result as said phase-difference input signal, and wherein said gate circuit is a NAND circuit, and said phase-difference detecting signal is not activated when the activation period of said phase-difference input signal is shorter than said predetermined value of said phase difference.

7. The lock detector according to claim 1, wherein at least one of said first and second pulse signals is a continuous pulse signal that repeat oscillation without interruption; and said latch circuit is a NAND latch circuit to which said continuous pulse signal and said phase-difference detecting signal are inputted.

8. The lock detector according to claim 1, wherein said signal output part is a D-flip-flop having a signal input terminal and a reset input terminal, an active signal being always inputted to said signal input terminal, said reset signal being inputted to said reset input terminal.

9. The lock detector according to claim 1, further comprising:

a counter that counts the number of said oscillation of one of said first and second pulse signals and activates output when said number reaches N(>0), and resets said number when said reset signal is activated, wherein said lock detecting signal can be activated in said signal output part when said output of said counter is activated.

10. A phase locked loop circuit comprising:

a lock detector according to claim 1;

a phase comparator to compare phases of said first and second pulse signals, taking one of these signals as an input signal and taking the other as a feedback signal;

a filter that outputs a control signal based on a comparison result of said phase comparator; and an oscillation circuit that outputs said feedback signal based on said control signal.

11. The phase locked loop circuit according to claim 10, wherein said phase-difference detecting part includes:

a delay circuit to delay a phase-difference input signal being activated by a predetermined-direction signal change of one of said first and second pulse signals and being deactivated by said predetermined-direction signal change of the other signal of said first and second pulse signals; and a gate circuit that operates OR or reverses AND of said phase-difference input signal and an output of said delay-circuit, and outputs its result as said phase-difference detecting signal, and wherein said control signal is also inputted to said delay circuit, thereby controlling a delay amount on said delay circuit.

12. The phase locked loop circuit according to claim 10, further comprising:

an output control part capable of controlling whether said feedback signal should be outputted or not; and a switch to output either of said input signal and said feedback signal, wherein said switch outputs said feedback signal when said output control part outputs said feedback signal, and said switch outputs said input signal when said output control part does not output said feedback signal, and wherein said reset signal output part includes:
- a phase-difference detecting part that activates a phase-difference detecting signal when detecting said phase difference between said first and second pulse signals; and
- a latch circuit that latches said phase-difference detecting signal for a predetermined period and outputs it as said reset signal,
  - the signal change of said reset signal on the latch circuit being controlled by the output of said switch.

13. The phase locked loop circuit according to claim 10, further comprising:

a frequency divider to divide said feedback signal; and a gate circuit that receives to perform logical operation of said frequency divider and said reset signal, and wherein the output of said gate circuit controls the activation of said lock detecting signal in said signal output part.

14. The phase locked loop circuit according to claim 10, wherein said reset signal output part includes:
- a phase-difference detecting part that activates a phase-difference detecting signal when detecting said phase difference between said first and second pulse signals; and
- a latch circuit that latches said phase-difference detecting signal for a predetermined period and outputs it as said reset signal, said phase-difference detecting part includes:
- a delay circuit to delay a phase-difference input signal being activated by a predetermined-direction signal change of one of said first and second pulse signals and being deactivated by said predetermined-direction signal change of the other signal of said first and second pulse signals; and
- a gate circuit that operates OR or NAND of said phase-difference input signal and an output of said delay-circuit and outputs its result as said phase-difference detecting signal, and wherein said comparison result of said phase comparator is outputted as two comparison result signals having different pulse widths, one of said comparison result signals being inputted to said filter, and the other of said comparison result signals being inputted to said phase-difference detecting part as said phase-difference input signal.

* * * * *